(12) United States Patent
Koya et al.

(10) Patent No.: US 8,773,925 B2
(45) Date of Patent: Jul. 8, 2014

(54) MULTILEVEL DRAM

(75) Inventors: Yoshihito Koya, Tokyo (JP); Brent Haukness, Monte Sereno, CA (US)

(73) Assignee: Rambus Inc., Sunnyvale, CA (US)

( * ) Notice: Subject to any disclaimer, the term of this patent is extended or adjusted under 35 U.S.C. 154(b) by 29 days.

(21) Appl. No.: 13/578,498

(22) PCT Filed: Dec. 1, 2010

(86) PCT No.: PCT/US2010/058533
§ 371 (c)(1),
(2), (4) Date: Aug. 10, 2012

(87) PCT Pub. No.: WO2011/106054
PCT Pub. Date: Sep. 1, 2011

(65) Prior Publication Data
US 2012/0314484 A1 Dec. 13, 2012

Related U.S. Application Data

(60) Provisional application No. 61/307,074, filed on Feb. 23, 2010.

(51) Int. Cl.
*G11C 7/10* (2006.01)
(52) U.S. Cl.
USPC .................. 365/189.18; 365/189.15; 365/149
(58) Field of Classification Search
USPC .................................. 365/149, 189.15, 189.18
See application file for complete search history.

(56) References Cited

U.S. PATENT DOCUMENTS

| 4,661,929 A | 4/1987 | Aoki et al. ..................... 365/189 |
| 4,709,350 A | 11/1987 | Nakagome et al. ............. 365/45 |
| 5,532,955 A | 7/1996 | Gillingham ................... 365/149 |

(Continued)

FOREIGN PATENT DOCUMENTS

| KR | 10-1996-0003449 B1 | 2/1996 | ............. A61M 5/14 |
| KR | 10-2000-0004509 A | 1/2000 | ............... H01Q 3/02 |
| WO | WO 00-74067 A1 | 12/2000 | ............. G11C 11/56 |

OTHER PUBLICATIONS

Furuyama et al., "An Experimental 2-bit/Cell Storage DRAM for Macrocell or Memory-on-Logic Application", Apr. 1989, IEEE Journal of Solid-State Circuits, pp. 388-393.*

(Continued)

*Primary Examiner* — Hoai V Ho
*Assistant Examiner* — Jay Radke
(74) *Attorney, Agent, or Firm* — Silicon Edge Law Group LLP; Arthur J. Behiel

(57) ABSTRACT

A multi-level dynamic random-access memory (MLDRAM) represents an original bit combination of more than one bit using a cell voltage stored in a single memory cell. The cell voltage is in one of a number of discrete analog voltage ranges each corresponding to a respective one of the possible values of the bit combination. In reading a selected memory cell, stored charge is conveyed via a local bitline to a preamplifier. The preamplifier amplifies the signal on the local bitline and drives a global bitline with an analog signal representative of the stored voltage. A digitizer converts the analog signal on the global bitline into a read bit combination. The read bit combination is then moved to a data cache over the global bitline. The data cache writes an analog voltage back to the memory cell to write a new value or restore data destroyed in reading the cell.

21 Claims, 23 Drawing Sheets

(56) References Cited

U.S. PATENT DOCUMENTS

| | | | |
|---|---|---|---|
| 5,612,912 A | 3/1997 | Gillingham | 365/168 |
| 5,917,748 A | 6/1999 | Chi et al. | 365/168 |
| 6,151,260 A | 11/2000 | Birk | 365/207 |
| RE37,072 E | 2/2001 | Gillingham | |
| 6,282,115 B1 | 8/2001 | Furukawa et al. | 365/149 |
| 6,373,766 B1 | 4/2002 | Birk | 365/207 |
| 6,456,521 B1 | 9/2002 | Hsu et al. | 365/149 |
| 6,556,469 B2 | 4/2003 | Birk et al. | 365/149 |
| 6,839,267 B1 | 1/2005 | Poechnueller | 365/149 |
| 6,969,652 B2 | 11/2005 | Knoedgen | 438/258 |
| 7,133,311 B2 | 11/2006 | Liu | 365/168 |
| 7,158,410 B2 | 1/2007 | Bhattacharyya et al. | 365/185 |
| 7,349,252 B2 | 3/2008 | Bhattacharyya et al. | 365/185 |
| 7,379,336 B2 | 5/2008 | Bhattacharyya et al. | 365/185.18 |
| 7,403,416 B2 | 7/2008 | Bhattacharyya et al. | 365/185 |
| 2002/0181306 A1 | 12/2002 | Birk | 365/207 |
| 2004/0057355 A1 | 3/2004 | Rudelic et al. | 369/47.1 |
| 2005/0018501 A1 | 1/2005 | Knoedgen | 365/202 |
| 2005/0174841 A1 | 8/2005 | Ho | 365/185.03 |
| 2007/0096191 A1 | 5/2007 | Lee et al. | 257/309 |
| 2007/0103955 A1* | 5/2007 | Manning et al. | 365/63 |

OTHER PUBLICATIONS

PCT Search Report and the Written Opinion dated Aug. 2, 2011 re Int'l. Application No. PCT/US2010/058533. 13 Pages.

"DRAM (Dynamic Random Access Memory) Leakage Path Analysis", http://www.paper.edu.cn, Aug. 21, 2010. 10 pages.

Birk, Gershom et al., "A Comparative Simulation Study of Four Multilevel DRAMs", University of Alberta slides, 1999. 20 pages.

International Preliminary Report on Patentability (Chapter I) dated Sep. 7, 2012 in International Application No. PCT/US10/058533. 9 pages.

* cited by examiner

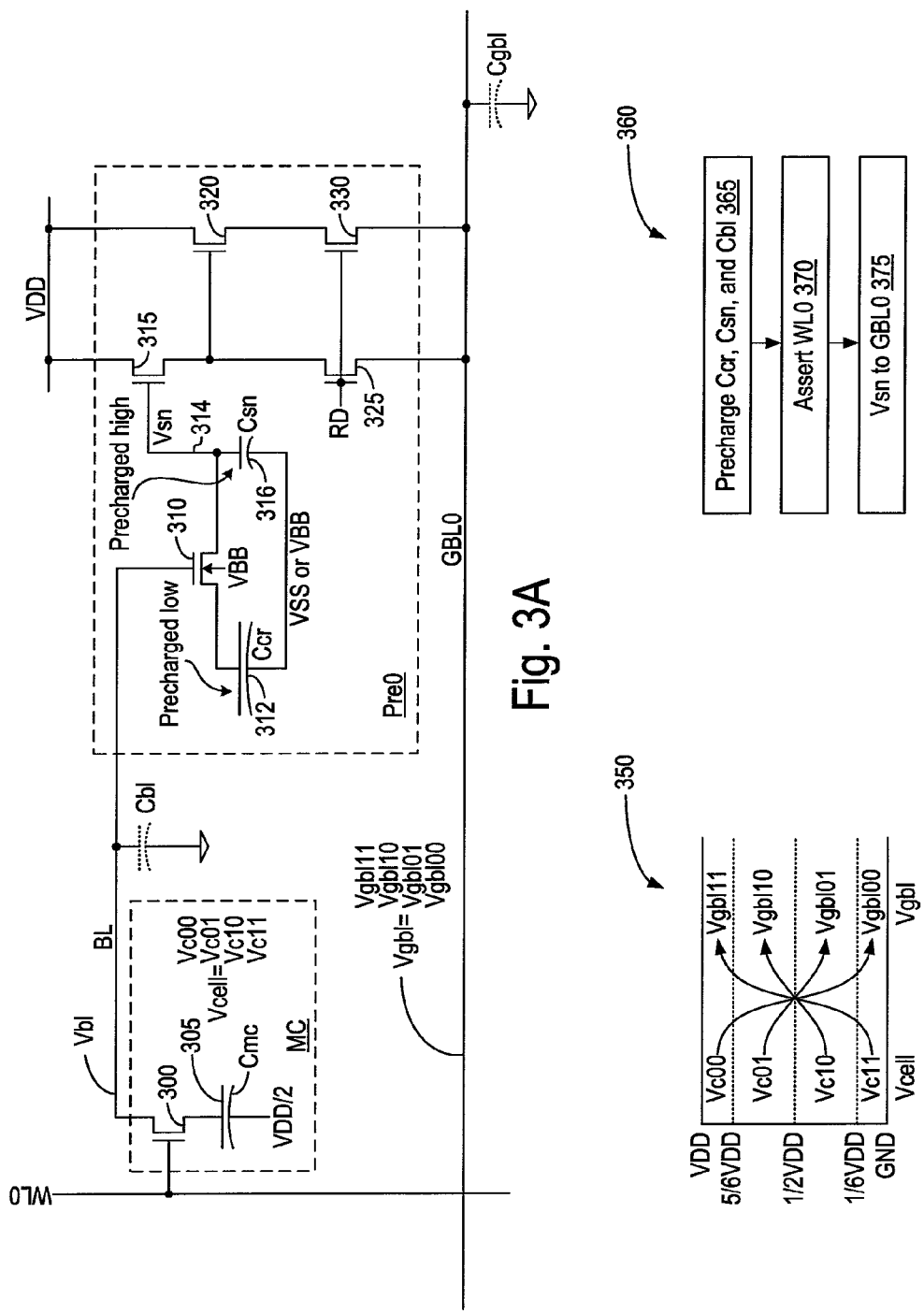

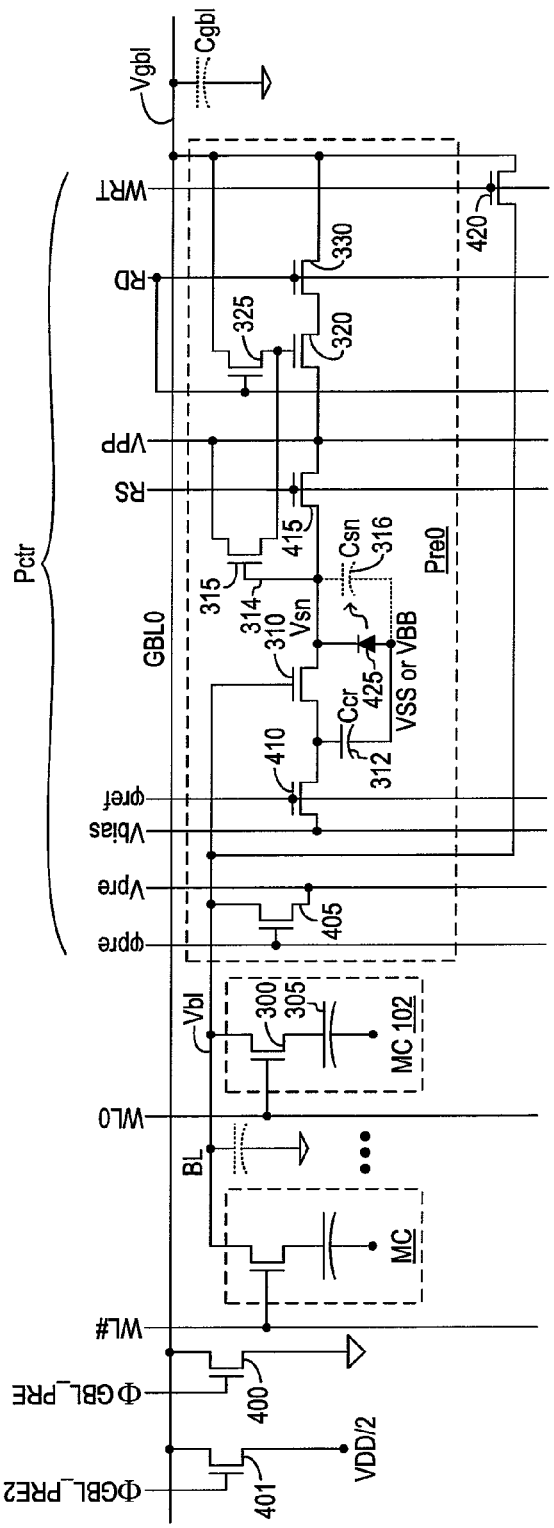
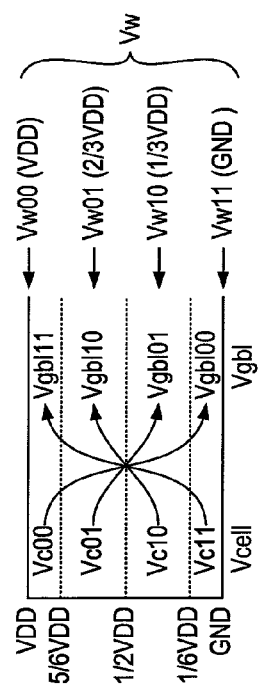
Fig. 4A
Fig. 4B

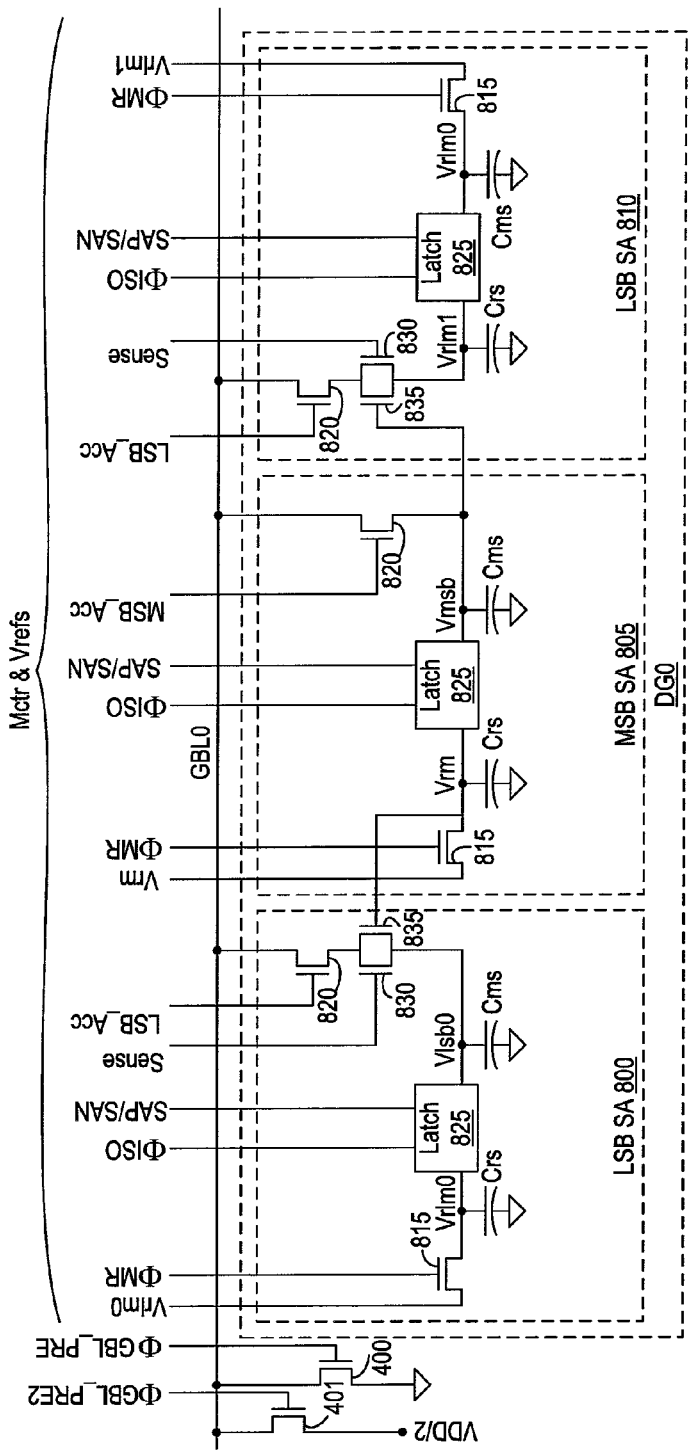
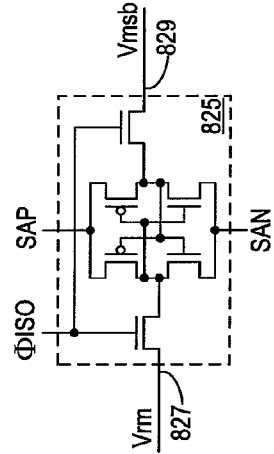
Fig. 8A
Fig. 8B

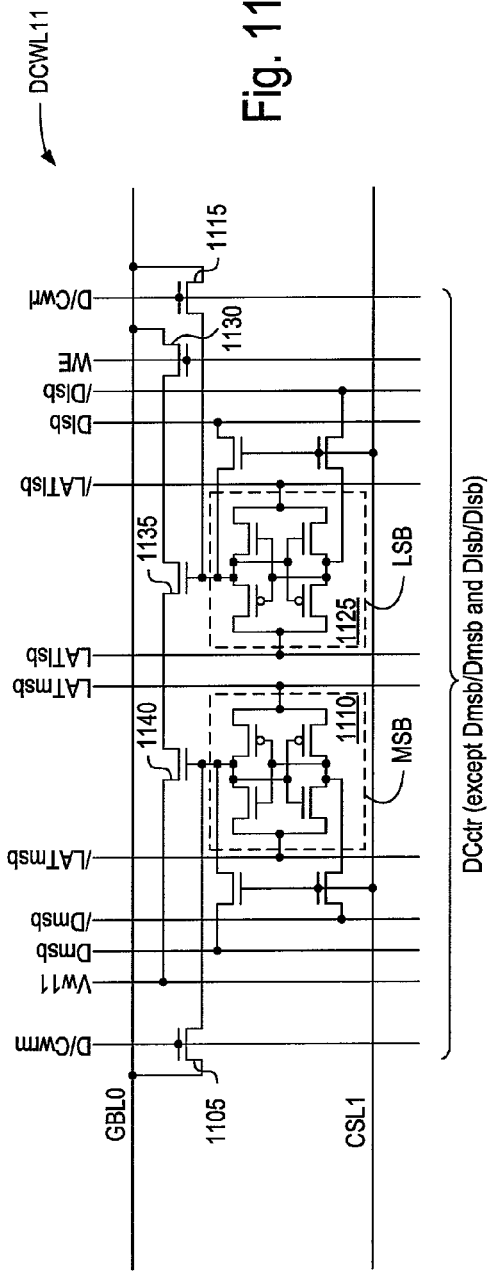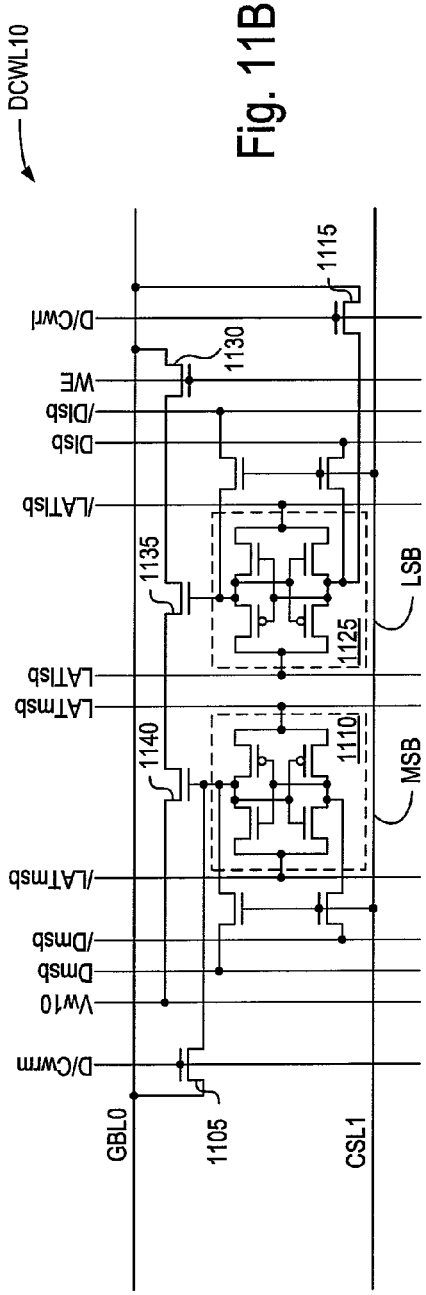
Fig. 11A
Fig. 11B

MULTILEVEL DRAM

BACKGROUND

Dynamic random-access memory (DRAM) is a type of computer data storage. The term "random-access" alludes to the fact that data can be written to and read from designated addresses at random, as opposed to having to increment through a sequence of addresses to get to a designated location. DRAM stores digital data as representative voltages in storage capacitors. For example, a relatively high voltage or a relatively low voltage on a given capacitor can represent a logic one or a logic zero, respectively. The storage capacitors leak their stored charge, so the stored voltages quickly change with time. The information the voltages represent thus fades unless the stored voltages are periodically refreshed. That is, each memory cell is read and the voltage on it refreshed before the stored voltage has an opportunity to change so much that it no longer represents the originally stored data.

Each DRAM memory cell of the type described above stores a single logical bit, which can represent either a one or a zero. For example, a stored voltage in a range above a reference voltage may represent a logic one and below the reference voltage a logic zero. Storage density could be increased if more than one bit could be stored in a single memory cell. This is the concept behind multilevel DRAM (MLDRAM). In general, in MLDRAM, an n-bit digital value is represented by a single voltage that can be in one of $2^n$ voltage ranges. Each voltage range corresponds to a respective one of the $2^n$ possible states of the n-bit value. In conventional DRAM, one bit is stored in a single memory cell using $2^1=2$ voltage ranges. In an example of MLDRAM, two bits can be stored in a single memory cell if the MLDRAM can reliably identify the one of $2^2=4$ voltage ranges to which the voltage belongs. In theory, a two-bit MLDRAM could increase the storage density by a factor of about two.

The main disadvantage of MLDRAM is that the greater number of voltage ranges used to represent the additional data bit or bits reduces the extent of each voltage range and, hence, the difficulty of reliably identifying the voltage range to which the voltage stored in the memory cell belongs. Further, the memory cells of MLDRAM may require more frequent refreshing because the stored voltages can more quickly decay to the next-lower voltage range. Practical MLDRAM circuits will require improved methods and circuits for storing, sensing, and refreshing voltages representing multiple bits.

BRIEF DESCRIPTION OF THE DRAWINGS

The subject matter disclosed is illustrated by way of example, and not by way of limitation, in the figures of the accompanying drawings and in which like reference numerals refer to similar elements and in which:

FIG. 3A depicts a memory cell MC coupled to a preamplifier Pre0 via a local bitline BL, all of FIG. 2A, in accordance with one embodiment.

FIG. 3B is a diagram 350 illustrating the relationship between cell voltage Vcell and global bitline voltage Vgbl in accordance with an embodiment in which the cell voltage Vcell varies between ground potential and supply voltage VDD.

FIG. 3C is a flowchart 360 outlining how preamplifier Pre0 of FIG. 3A is used to read an associated memory cell MC.

FIG. 4A is a schematic diagram detailing another embodiment of preamplifier Pre0 of FIG. 2A, associated memory cells MC, and global and local bitlines GBL0 and BL.

FIG. 4B is a diagram illustrating the relationship between memory-cell voltage Vcell, global bitline voltage Vgbl, and write voltage Vw.

FIG. 8A is a detailed embodiment of a digitizer DG0 of FIG. 2A, which is identical to digitizers DG[3:1] in this example.

FIG. 8B depicts an embodiment of latch 825 in sense amplifier 805 of FIG. 8A.

FIGS. 11A, 11B, 11C, and 11D detail the set of four blocks DCWL11, DCWL10, DCWL01, and DCWL00 that collectively form the data cache/write circuit DC/W0 connected to the highlighted global bitline GBL0 of FIG. 2A and FIG. 10 in accordance with one embodiment.

DETAILED DESCRIPTION

Dynamic random-access memory (DRAM) is a type of RAM that stores digital data as representative voltages across storage capacitors. For example, a relatively high or a relatively low voltage on a given storage capacitor can represent a logic one or a logic zero, respectively. The storage capacitors leak their stored charge, so the stored voltages quickly change with time. The information the voltages represent thus fades unless the stored voltages are periodically refreshed. That is, each storage cell is read and the voltage on it refreshed before the stored voltage has an opportunity to change so much that it no longer represents the originally stored data. In modern DRAM circuits, millions of capacitive memory cells must be refreshed at intervals measured in milliseconds. DRAM is therefore active even absent the reading or writing of data, and this essentially constant activity is why DRAM is referred to as "dynamic."

The need to dynamically refresh DRAM memory cells presents difficulties, but these difficulties are usually outweighed by the structural simplicity of the DRAM memory cell. Only a single access transistor is required for a DRAM memory cell, compared with a minimum of four transistors for other types of RAM. The relatively small and simple DRAM memory cell allows DRAM to reach very high storage densities at a cost that is low relative to alternative memory technologies. These advantages have lead to the widespread use of DRAM technologies in e.g. servers, workstations, personal computers, digital televisions, and set-top boxes.

Figure 1A:
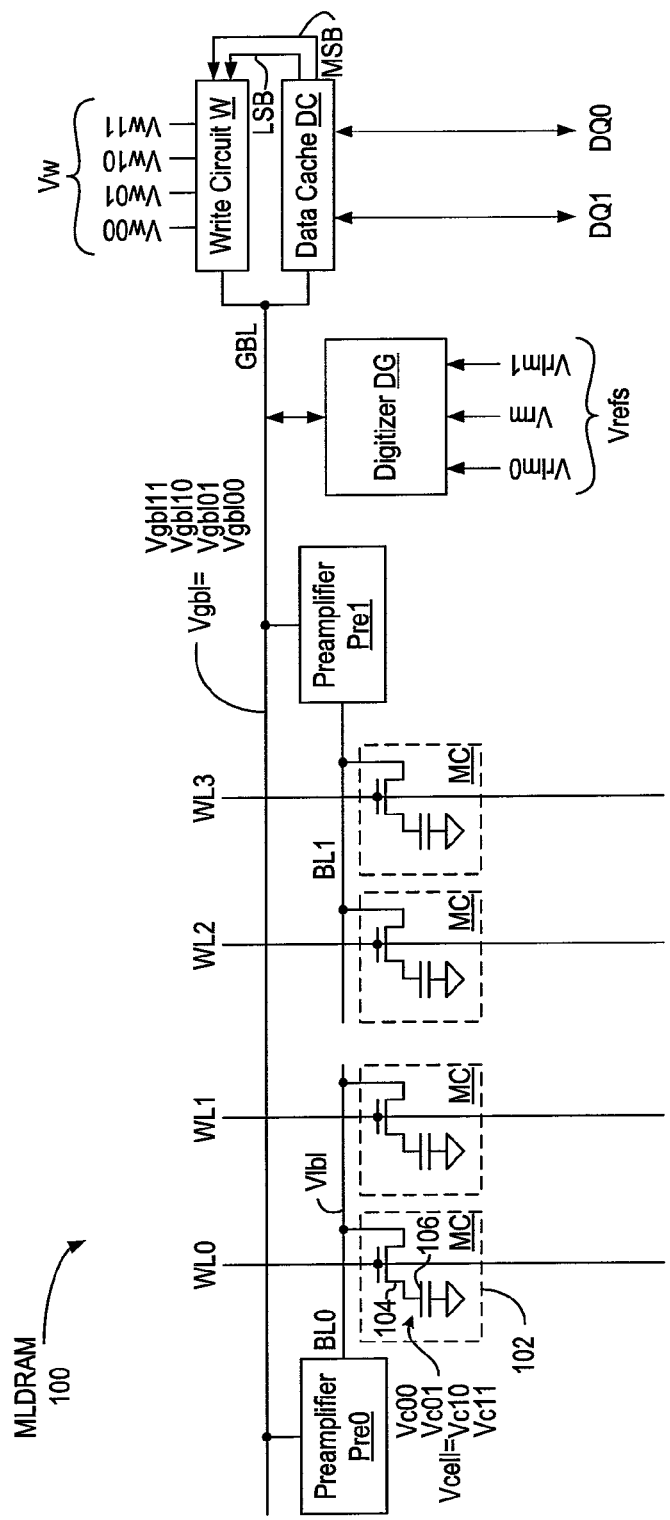
FIG. 1A depicts a multi-level dynamic random-access memory (MLDRAM) 100 in accordance with one embodiment.

FIG. 1A depicts a highly simplified example of a multi-level dynamic random-access memory (MLDRAM) 100 in accordance with one embodiment. MLDRAM 100 includes an array of memory cells MC, an exemplary one of which is shown at 102. Each of the memory cells stores a cell voltage Vcell representing two or more two binary digits, or bits, in a storage capacitor. The two or more bits represented by the cell voltage is referred to as a bit combination. In the examples described herein, each bit combination is composed of two bits. In other examples, each bit combination is composed of more than two bits. For bit combinations having n bits, $2^n$ possible bit combinations exist.

In MLDRAM 100, each of the four possible bit combinations having two bits is represented by setting voltage Vcell to a voltage within a corresponding one of four voltage ranges. These voltage ranges are named to indicate the bit combinations they represent; namely, the relatively high voltage range Vc00 represents bit combination 00, a lower voltage range Vc01 represents bit combination 01, a still lower voltage range Vc10 represents bit combination 10, and the lowest voltage range Vc11 represents bit combination 11. Other relationships between voltage ranges and the bit combinations they represent are possible and may be used, and additional voltage ranges can be used to enable the voltage stored in each memory cell to represent bit combinations composed of additional bits. For example, eight voltage ranges can be used to enable the voltage stored in each memory cell to represent bit combinations composed of three bits.

An access transistor in each memory cell selectively couples a respective integrated or parasitic storage capacitor to one of two local bitlines BL[1:0]. The access transistors operate in response to wordline signals on corresponding wordlines WL[3:0]. Using a memory cell 102 as an example, asserting wordline signal WL0 on the corresponding signal line causes access transistor 104 to couple the storage capacitor 106 to local bitline BL0, and thus brings the local bitline voltage Vlbl to a voltage proportional to the cell voltage Vcell. Local bitline BL has a capacitance substantially greater than that of storage capacitor 106, so that the change in the voltage Vlbl on local bitline BL resulting from imposing cell voltage Vcell thereon is small. Moreover, the voltage ranges of local bitline voltage Vlbl that correspond to the above-described voltage ranges of cell voltage Vcell span a very small range of voltage and would therefore be difficult to distinguish from one another.

In MLDRAM 100, each local bitline BL[1:0] is connected to a respective preamplifier Pre[1:0], which amplifies the respective local bitline voltage to provide an analog global bitline voltage Vgbl on a global bitline GBL. The preamplifier compensates for the attenuation of cell voltage Vcell when the cell voltage is imposed on local bitline BL so that the gamut of global bitline voltage Vgbl is nominally equal to that of cell voltage Vcell, and global bitline voltage Vgbl has voltage ranges similar to those of cell voltage Vcell.

The global bitline connects preamplifiers Pre[1:0] to a digitizer DG, a data cache DC, and a write circuit W. Digitizer DG converts global bitline voltage Vgbl on global bitline GBL to a two-bit bit combination having a most-significant bit (MSB) and a least-significant bit (LSB). Since the gamut of global bitline voltage Vgbl on global bitline GBL is nominally equal to that of cell voltage Vcell, digitizer DG can reliably determine the voltage range to which global bitline voltage Vgbl belongs, and can therefore reliably generate the appropriate bit combination. Data cache DC stores the MSB and LSB from digitizer DG when reading from a memory cell, or accepts a new MSB and a new LSB from data lines DQ1 and DQ0 when such new bit combination is to be written to a memory cell. Write circuit W selects a write voltage Vw of a level corresponding to the MSB and LSB stored in data cache DC, and outputs the write voltage for writing to a selected memory cell during refresh or write operation.

Figure 1B:
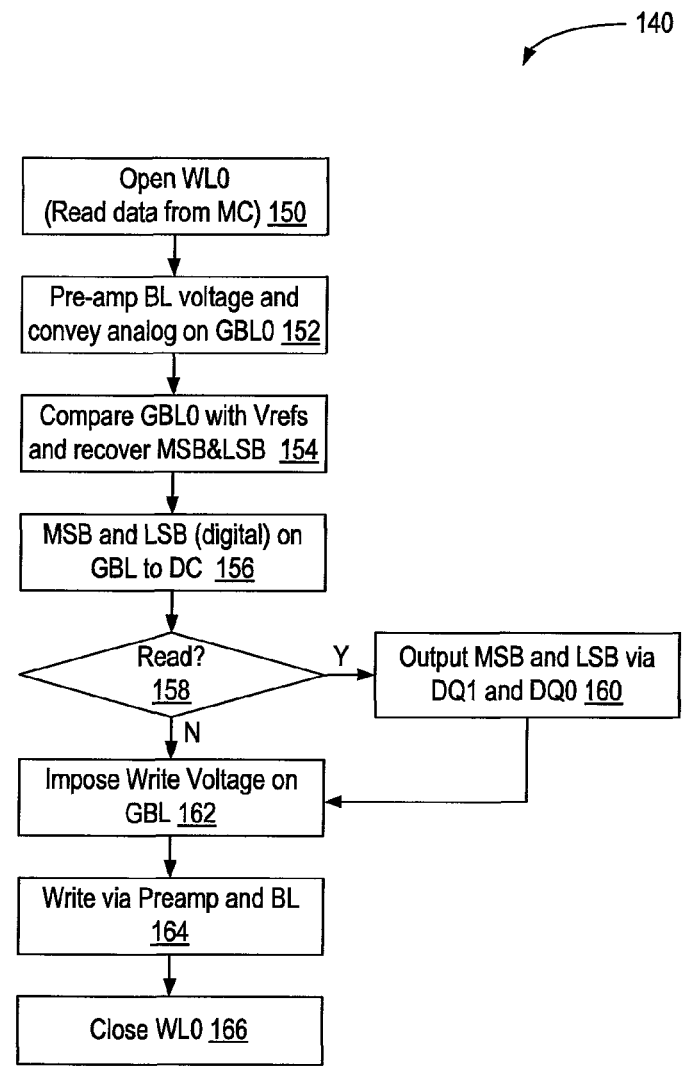
FIG. 1B is a flowchart 140 depicting how a memory cell MC in MLDRAM 100 of FIG. 1A is read from and written to in accordance with one embodiment.

FIG. 1B is a flowchart 140 depicting how exemplary memory cell 102 in MLDRAM 100 of FIG. 1A is read from, refreshed, and written to in accordance with one embodiment. With reference to FIG. 1A, this example assumes the bit combination of interest is (when a read operation is performed), or will be (when a write operation is performed), represented by a voltage stored within memory cell 102 associated with wordline WL0 and preamplifier Pre0.

To begin, wordline WL0 is asserted to open memory cell 102 (150), thus sharing the charge stored in the memory cell with local bitline BL0. The cell voltage Vcell due to the stored charge represents a bit combination composed of more than one bit, so the local bitline voltage Vlbl that results from the charge sharing likewise represents such bit combination. Preamplifier Pre0 amplifies local bitline voltage Vlbl and imposes the resulting analog voltage onto global bitline GBL (152) as global bitline voltage Vgbl. Global bitline voltage Vgbl is proportional to and is inverted with respect to local bitline voltage Vlbl, and consequently to cell voltage Vcell, and thus preserves the information read from memory cell 102. The voltage ranges for voltage Vgbl are named to indicate the respective bit combinations they represent, with the relatively high voltage range Vgbl11 representing bit combination 11, a lower voltage range Vgbl10 representing bit combination 10, a still lower range Vgbl01 representing bit combination 01, and the lowest voltage range Vgbl00 representing bit combination 00. As with the cell and bitline voltages, other relationships between voltage ranges and represented bit combinations are possible and may be used.

Digitizer DG compares the global bitline voltage Vgbl received from the global bitline with three reference voltages Vrlm0, Vrm, and Vrlm1 to identify which voltage range the global bitline voltage Vgbl falls within, and thus to determine the bit combination, composed of an MSB and an LSB, represented by global bitline voltage Vgbl (154). For example, should global bitline voltage Vgbl fall within voltage range Vgbl10, then digitizer DG outputs a bit combination composed of an MSB=1 and an LSB=0.

Having thus determined the bit combination represented by the cell voltage stored in memory cell 102, digitizer DG serially imposes the MSB and LSB of the bit combination on global bitline GBL0. The MSB and LSB are successively latched by data cache DC (156). The MSB is latched before the LSB in this example, but the order can be reversed. Per decision 158, if the memory access is for a read operation, then data cache DC outputs the cached MSB and LSB received from digitizer DG via data lines DQ1 and DQ0, respectively (160). The MSB and LSB constitute a read bit combination that is identical to the original bit combination represented by cell voltage Vcell. Output operation 160 is skipped when a memory cell is accessed as part of a write or refresh transaction.

Reading the memory cell depletes the charge stored therein, and consequently destroys the data represented by the stored charge. The memory cell voltage Vcell is therefore refreshed using the MSB and LSB stored in data cache DC. Write circuit W is used for this purpose.

When refreshing or writing to memory cell 102, data cache DC presents the MSB and LSB to write circuit W, which responds by imposing on global bitline GBL the one of four write voltages Vw00, Vw01, Vw10, and Vw11 corresponding to the MSB and LSB (162). These write voltages, as their names imply, respectively represent bits 00, 01, 10, and 11 when stored in a memory cell. Preamplifier Pre0 associated with open memory cell 102 includes a pass gate (not shown) that conveys the write voltage from global bitline GBL to local bitline BL0 for storage in the open memory cell MC 102 (164). Finally, wordline signal WL0 is deasserted, or the wordline closed, to deactivate access transistor 104 and thus retain the write voltage in the now closed memory cell 102. Operations to write a voltage representing new data in memory cell 102 are performed in the manner disclosed above for the refresh operation except that the new data is conveyed to data cache DC via data lines DQ1 and DQ0 before the write operation begins at 162. The remaining memory cells MC are read from, refreshed and written to using operations similar to those just described.

Figure 2A:
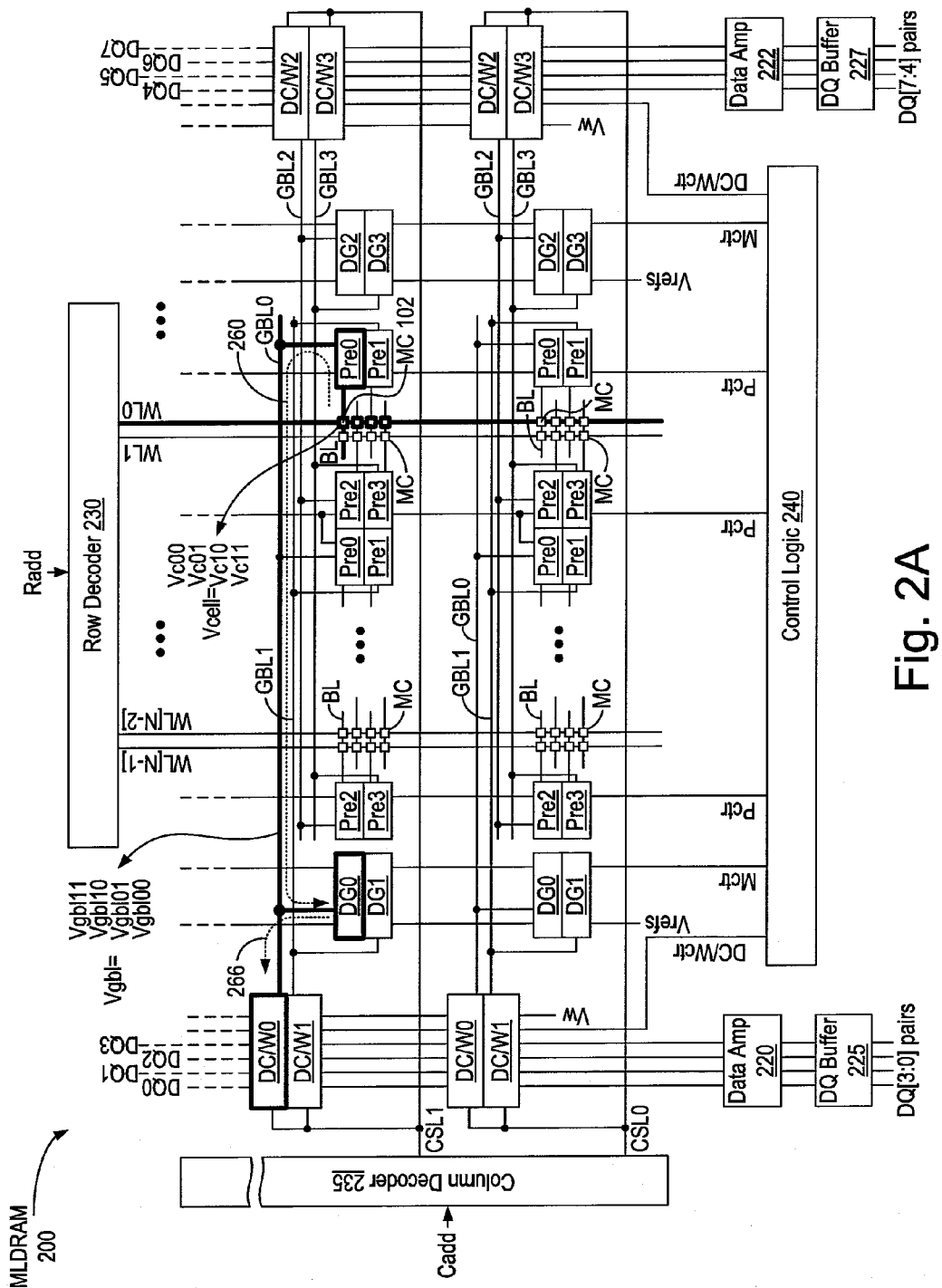
FIG. 2A depicts a multi-level dynamic random-access memory (MLDRAM) 200 in accordance with another embodiment.

FIG. 2A depicts an example of a multi-level dynamic random-access memory (MLDRAM) 200 in accordance with another embodiment. MLDRAM 200 includes an array of memory cells MC, an exemplary one of which is shown at 102. Each of the memory cells, in the example shown, stores a cell voltage Vcell that represents two bits of information. Cell voltage Vcell is set to a voltage within one of four voltage ranges, each of which represents a respective bit combination composed of two bits. These voltage ranges are named to indicate the respective bit combinations they represent; namely, the relatively high voltage range Vc00 represents bit combination 00, a lower voltage range V01 represents bit combination 01, a still lower voltage range Vc10 represents bit combination 10, and the lowest voltage range Vc11 represents bit combination 11. Other relationships between voltage ranges and bit combinations may be used, and cell voltage Vcell can be divided into more or fewer ranges to represent more or fewer bits.

MLDRAM 200 includes a number of duplicate structures. These include data cache/write circuits DC/W[3:0], digitizers DG[3:0], preamplifiers Pre[3:0], data amplifiers 220, 222, and data buffers 225, 227. MLDRAM 200 additionally includes row and column decoders 230 and 235, and control logic 240 to manage the flow of data to and from memory cells MC. The following discussion details the operation of MLDRAM 200 using signal paths and circuit elements highlighted using relatively bold lines. The remaining similar structures behave similarly, so a discussion of those is omitted for brevity. A practical implementation of an MLDRAM will support many more rows and columns of memory cells than are depicted in FIG. 2A.

MLDRAM 200 stores information in arrays of memory cells MC arranged in rows and columns. Contrary to the normal meanings of "row" and "column" in the DRAM art, the columns are arranged from top to bottom and the rows are arranged from left to right in FIG. 2A. Each row of memory cells, commonly called a "page," is uniquely addressable using a row address Radd. Row decoder 230 decodes a specified row address Radd to assert one of N wordlines WL[N−1:0], which opens each memory cell MC of the page. To "open" a memory cell is to present its contents on a respective local bitline BL, so opening a page of memory cells presents the stored voltages of a page of memory cells on respective local bitlines BL. Each access operation activates an entire page (row) of memory cells, so data transfers that read or write to MLDRAM 200 are collectively referred to as "page-access operations." Refresh operations are also accomplished on a per-page basis, and can likewise be considered a type of page-access operation. In this example, a wordline signal WL0 on the like-identified wordline is asserted to open eight memory cells MC.

Columns or groups of columns are uniquely addressable using a column address Cadd. Column decoder 235 decodes a specified column address Cadd to assert one of column-select lines CSL[1:0]. In this embodiment, column decoder 235 can activate respective data cache/write circuits DC/W [0:3] associated with four memory cells MC of an open page by asserting one of column select lines CSL0 or CSL1. Each memory cell stores a cell voltage Vcell that represents a bit combination composed of two bits, so activating the data cache/write circuits associated with four memory cells allows cell voltages representing eight bits to be read from or written to the memory cells. Assuming column select line CSL1 is asserted, the uppermost four memory cells associated with wordline WL0 are enabled for read or write access.

The array of memory cells MC is divided into sub-arrays disposed between vertical stripes of preamplifiers. The word-lines WL extend over the sub-arrays and between the stripes of preamplifiers from a perspective normal to the device substrate, and to the illustration of FIG. 2A. Preamplifiers Pre[3:0] are laid out such that alternate local bitlines BL connect to preamplifiers in alternate stripes. This arrangement is used to relax the pitch of the preamplifiers.

Preamplifiers Pre[3:0] are coupled to respective digitizers DG[3:0] via global bitlines GBL[3:0]. Though shown outside of the memory arrays from a perspective normal to the device substrate in FIG. 2A, the global bitlines can extend over the memory cells in other embodiments. This routing can be accomplished using relatively long vias to interconnect the global bitlines to the underlying transistors, which in turn necessitates relatively large contact areas for the vias. Alternating the preamplifiers, as shown, to relax the pitch of the digitizers and preamplifiers makes it easier to accommodate these larger contact areas. Multiple local bitlines BL can be switchably connected to a shared preamplifier to further relax the pitch of the digitizers.

Figure 2B:
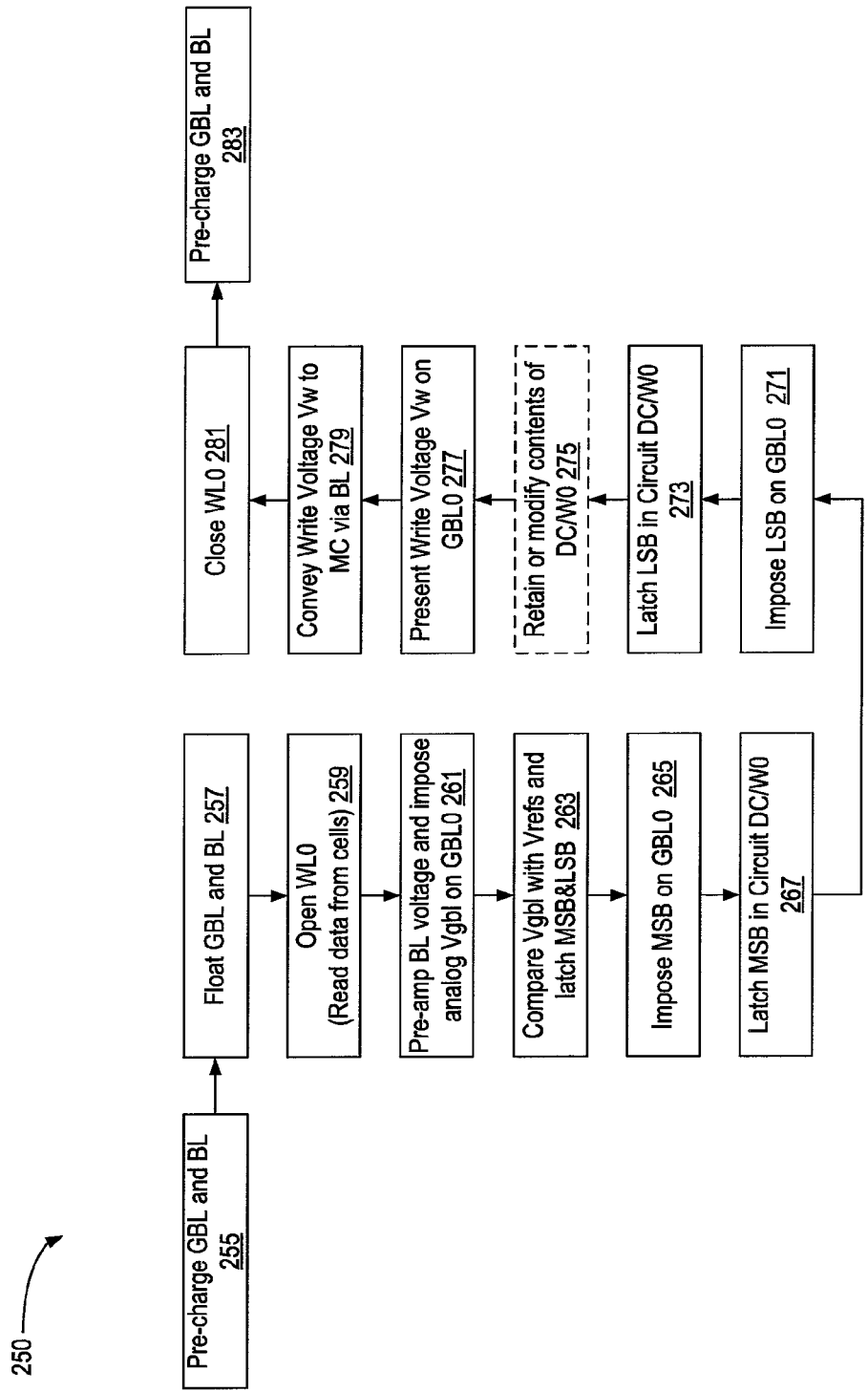
FIG. 2B is a flowchart 250 depicting a page access operation used to read from, write to, or refresh a page of memory cells MC (e.g., all the memory cells MC of FIG. 2A associated with wordline WL0).

FIG. 2B is a flowchart 250 depicting a page access operation used to read from, write to, or refresh a page of memory cells MC (e.g., all the memory cells MC of FIG. 2A associated with wordline WL0). For simplicity, the access operation of flowchart 250 is described with reference to exemplary memory cell 102, the uppermost memory cell associated with wordline WL0 of FIG. 2A. The highlighted memory cell 102 is assumed to be accessed either for refresh purposes, to read from the memory cell, or to write new data to the memory cell.

Before the access starts, the local and global bitlines BL and GBL[3:0] are pre-charged to a known voltage level, such as ground potential (255). The pre-charged bitlines are then allowed to float at their respective pre-charge levels in preparation for receiving charge from memory cell 102 (257). Wordline signal WL0 is then asserted to open the corresponding page of memory cells, and consequently to convey their contents to respective preamplifiers Pre[3:0] via respective local bitlines BL (259). Memory cell 102 is coupled to preamplifier Pre0 via an associated local bitline BL: the flow of charge from the memory cell 102 of FIG. 2A is illustrated using a dashed arrow 260. All of the other open memory cells behave identically, so a detailed discussion of the other open memory cells is omitted for brevity.

Still following dashed arrow 260 of FIG. 2A, preamplifier Pre0 amplifies the voltage change on the local bitline BL that results from charge sharing between the open memory cell 102 and the capacitance of the local bitline, and imposes the resulting amplified analog signal on global bitline GBL0 as global bitline voltage Vgbl (261). In the depicted embodiment, preamplifier Pre0 inverts the sense of cell voltage Vcell in producing global bitline voltage Vgbl. The voltage ranges voltage Vgbl takes to represent each bit combination are therefore inverted compared with the corresponding voltage ranges of cell voltage Vcell. Relatively high memory-cell voltages Vcell thus produce relatively low global bitline voltages Vgbl, and vice versa. For example, preamplifier Pre0 amplifies a memory cell voltage Vcell within the lowest voltage range Vc11 to produce a global bitline voltage Vgbl within the highest voltage range Vglb11. The behaviors of embodiments of preamplifier Pre0 are detailed below.

Global bitline voltage Vgbl on global bitline GBL0, whatever its level, is presented to digitizer DG0. Digitizer DG0 latches a bit combination of two bits corresponding to global bitline voltage Vgbl (263). The latched bits are identical to the bit combination originally represented by cell voltage Vcell. Digitizer DG0 does this by comparing the global bitline voltage Vgbl with three reference voltages Vref to find the most-significant bit (MSB) and least-significant bit (LSB) of the bit combinations. From lowest to highest, the three reference voltages are Vrlm0, Vrm, and Vrlm1. In brief, digitizer DG0 interprets global bitline voltages Vgbl above the middle reference voltage Vrm as representing an MSB of one, and global bitline voltages below reference voltage Vrm as representing an MSB of zero. With the MSB resolved, digitizer DG0 determines the LSB by comparing global bitline voltage Vgbl with the lowest reference voltage Vrlm0 if the MSB is zero or the highest reference voltage Vrlm1 if the MSB is one. Embodiments of digitizer DG0—and identical digitizers DG[3:1]—are described below.

Digitizer DG0 imposes the MSB onto global bitline GBL0 (265), as a relatively high or a relatively low voltage representing a one and a zero, respectively. The data cache portion of data cache/write circuit DC/W0 then latches the MSB. The information flow is indicated by arrow 266 in FIG. 2A (267). Digitizer DG0 and data cache/write circuit DC/W0 repeat these operations for the LSB (271, 273) so that both the MSB and LSB are cached in the data cache/write circuit. In this example the global bitline GBL0 conveys both the analog global bitline voltages Vgbl to digitizer DG0 and the digital MSB and LSB from digitizer DG0. This dual use reduces the number of conductors needed to implement MLDRAM 200, and thus saves valuable die area. In other embodiments a separate line from digitizer DG0 to data cache/write circuit DC/W0 might also be used to convey the MSB and LSB.

At this point in the process, preamplifier Pre0, digitizer DG0, and data cache/write circuit DC/W0 have cached the bit combination represented by the cell voltage read from memory cell 102 coupled to the open wordline WL0. The preamplifiers, digitizers, and data cache/write circuits associated with the other open memory cells have likewise cached the respective bit combinations represented by the voltages stored in those memory cells. The data cache/write circuits DC/W[3:0] associated with column select signals CSL1 and CSL0 thus cache the bit combinations represented by the voltages read from all the open memory cells MC coupled to wordline WL0. In other words, the data caches collectively contain an entire page of data.

This example assumes wordline WL0 has been opened as part of a read access to the uppermost four memory cells, namely, memory cell 102 and the three neighboring memory cells similarly highlighted along wordline WL0. The voltages stored in each of these four memory cells has been sensed and the corresponding MSB and LSB have been cached in a respective one of the data cache/write circuits DC/W[3:0] connected to column select line CSL1. To access this information, column select line CSL1 is asserted to couple the outputs of the upper set of four data cache/write circuits DC/W[3:0] to pairs of data output lines. For example, the highlighted cache/write circuit DC/W0 contains the bit combination obtained by reading the memory cell 102, and a digital signal representative of each of the two bits constituting the bit combination is applied to data lines DQ0 and DQ1, respectively, and from there to data amplifier 220 and buffer 225. The remaining cache/write circuits DC/W[3:1] that receive the asserted column select signal on line CSL1 likewise deliver their bit combinations on the six remaining data lines DQ[7:2]. The eight bits obtained by reading from the four highlighted memory cells, i.e., memory cell 102 and its three closest neighbors on wordline WL0, are thus made available at the outputs of buffers 225 and 227.

In read and refresh operations, the entire page stored in the data cache/write circuits DC/W[3:0] is written back to the open page of memory cells MC. Write operations are similar, except that write data received via external data lines DQ[7:0] is cached in a selected column of data cache/write circuits DC/W[0:3] before the page is written to the memory cells. In short, read and refresh operations simply retain the contents of data cache/write circuits DC/W[3:0], and write operations modify the contents of cache/write circuits DC/W[3:0] with the new data to be stored. These two possibilities are shown in FIG. 2B as 275.

Data cache and write circuit DC/W0 writes the bit combination cached therein to memory cell 102 as one of four write voltages Vw, each representing a respective one of the four possible bit combinations. To write to memory cell 102 in FIG. 2A, data cache/write circuit DC/W0 selects one of the four write voltages corresponding to the combination of MSB and LSB cached therein, and imposes the selected write voltage Vw on global data bitline GBL0 (277). The write voltage Vw is then written to the memory cell via global bitline GBL0, a pass gate in preamplifier Pre0 (FIG. 4A), and local bitline BL (279). With the appropriate write voltage written to the selected memory cell 102, row decoder 230 closes wordline WL0 (281), and all the global and local bitlines are once again pre-charged in anticipation of the next page access (283).

FIG. 3A depicts an example of memory cell MC coupled to an example of preamplifier Pre0 via a local bitline BL, all of FIG. 2A, in accordance with one embodiment. When wordline WL0 is asserted to open memory cell MC, the local bitline BL takes a voltage Vbl representative of the stored cell voltage Vcell, and thus of the bit combination represented by cell voltage Vcell. Preamplifier Pre0 amplifies bitline voltage Vbl to generate global bitline voltage Vgbl that likewise takes a value representative of the stored bit combination. The gamut of global bitline voltage Vgbl is divided into four voltage ranges Vgbl00, Vgbl01, Vgbl10, and Vgbl11, each of which represents the respective bit combination included in their respective labels (e.g., voltage range Vgbl00 represents bit combination 00). A digitizer, such as digitizer DG of FIG. 1A, determines the bit combination represented by global bitline voltage Vgbl, and, hence by the stored cell voltage Vcell.

FIG. 3B is a diagram 350 illustrating the relationship between cell voltage Vcell and global bitline voltage Vgbl for an example in which the gamuts of both the cell voltage Vcell and the global bitline voltage Vgbl are between ground potential and supply voltage VDD. Preamplifier Pre0 (FIG. 3A) is inverting, so the voltage ranges of cell voltage Vcell are inverted relative to those of global bitline voltage Vgbl. The voltage gamut between ground and VDD is divided into four voltage ranges, each of which represents a different bit combination. In the memory cells, the lowest voltage range Vc11, from about zero volts to about ⅙VDD, represents bit combination 11, and the highest range Vc00, from about ⅚VDD to VDD, represents bit combination 00. The high and low voltage ranges are each ⅙VDD, whereas the middle two voltage ranges Vc01 and Vc10 are twice as large at ⅓VDD. The reasons for the non-uniform voltage ranges are explained below in connection with FIGS. 4A and 4B.

Returning to FIG. 3A, memory cell MC conventionally includes a transistor 300 coupled to a storage capacitor 305 and controlled by wordline WL0. Capacitor 305, an integrated component or a parasitic capacitance, exhibits a memory-cell capacitance Cmc and is referenced to half the supply voltage VDD in this embodiment. When wordline signal WL0 is asserted, transistor 300 allows charge stored in capacitor 305 to charge the bitline capacitance Cbl of local bitline BL, and to consequently change local bitline voltage Vbl. The memory cell capacitance Cmc is much smaller than bitline capacitance Cbl, so the charge sharing between the two produces a relatively small voltage change on local bitline BL. Though smaller, the voltage change on bitline BL is proportional to the originally stored cell voltage Vcell, and this proportionality preserves the information originally represented by cell voltage Vcell. Preamplifier Pre0 amplifies the voltage Vbl on local bitline BL and imposes the resulting amplified analog voltage on signal on global bitline GBL0 as global bitline Vgbl.

Preamplifier Pre0 includes an input transistor 310 with current-handling terminals connected to respective ones of a charge reservoir capacitor 312 and a sense node 314. A sense node capacitor 316 is connected to sense node 314. In some implementations, the gate capacitance of transistor 315 connected to sense node 314 and other parasitic capacitances provide sense node capacitor Csn. Charge reservoir capacitor 312 and sense node capacitor 316 are also connected to a supply or reference-voltage node, such as VSS or VBB. VSS and VBB are, respectively, the electrical bias voltages applied respectively to the sources and p-wells of NMOS transistors. Input transistor 310 additionally has a body node connected to bias voltage node VBB. In setting up the bias on the body node of transistor 310, a negative value for voltage VBB may be selected to raise the effective threshold voltage of transistor 310, and thus reduce the sub-threshold leakage current of the device. The other NMOS transistors constituting preamplifier Pre0 can have the same or a different body bias.

Preamplifier Pre[3:0] additionally includes transistors 315, 320, 325, and 330. Transistors 315, 320, 325, and 330 constitute a buffer amplifier that, when activated by control signal RD is capable of imposing sense node voltage Vsn on global bit line GBL0 while imposing only a small capacitive load on sense node 314. The gate of transistor 315 is connected to sense node 314, and the gate of transistor 320 is connected to the source of transistor 315. The drains of transistors 315 and 320 are connected to supply VDD. Transistors 325 and 330 are connected in series between the sources of transistors 315 and 320, respectively, and global bitline GBL0. The gates of transistors 330 and 325 are connected to receive control signal RD that activates the transistors. With transistor 330 active in response to control signal RD, transistors 315 and 320 can be regarded as cascaded source followers. Transistor 315 is made small to reduce its gate capacitance, which contributes to the capacitance Csn of sense node capacitor 316. Making sense node capacitor (and hence transistor 315) small allows transistor 310 and charge reservoir capacitor 312 also to be relatively small. Transistor 320 is typically larger in area than transistor 315 and can therefore charge the capacitance of global bitline GBL0 much more quickly than transistor 315 could on its own.

FIG. 3C is a flowchart 360 outlining how preamplifier Pre0 of FIG. 3A is used to amplify bitline voltage Vbl when memory cell MC is being read. Referring additionally to FIG. 3A, memory cell 102 is read, capacitors 312 and 316 are precharged low and high, respectively (365). In this example, capacitor 312 is precharged to a near-ground bias voltage Vbias (FIG. 4), and capacitor 316 is precharged to one transistor threshold Vth above supply voltage VDD (i.e., to VPP=VDD+Vth).) Bitline capacitance Cbl is likewise precharged, e.g., to ground. The circuit elements used in precharging, omitted here for ease of illustration, are detailed below in connection with FIG. 4A. The precharge voltages on the source, drain, and gate of transistor 310 and the bias voltage VBB to the body terminal of transistor 310 are selected so that transistor 310 is on the verge of turning on.

Next, at 370, wordline WL0 is asserted to read cell voltage Vcell. Storage capacitor 305 shares charge with the parasitic capacitance Cbl of bitline BL until bitline voltage Vbl and the memory cell voltage Vcell reach equilibrium. The capacitance Cmc of storage capacitor 305 is considerably less than that of bitline capacitance Cbl, so the charge sharing between the two capacitances produces a change in bitline voltage Vbl that is small compared with the change in cell voltage Vcell. In an embodiment in which capacitance Cbl is ten times capacitance Cmc, cell voltage Vcell ranges from about zero to about 0.9 volts, and bitline capacitance Cbl is pre-charged to ground, for example, the bitline voltage after charge sharing ranges from about zero to about 0.09 volts.

Charge reservoir capacitor 312 can be fabricated of the same materials and have the same construction as storage capacitor 305 in memory cell 102. In this case, charge reservoir capacitor 312 can be referenced to half supply voltage VDD/2 as in the case of the cell capacitor Cmc as shown in FIG. 3A instead of VSS or VBB. The precharge voltages on the gate and source of transistor 310 (i.e., the precharge voltages on local bitline and charge reservoir capacitor 312) differ by the threshold voltage Vth of transistor 310, leaving transistor 310 on the verge of turning on. The increase in bitline voltage Vbl due to charge sharing will therefore cause transistor 310 to turn on, which allows charge to pass from sense-node capacitor 316 to charge reservoir capacitor 312. The charge transfer will continue until the voltage on charge reservoir capacitor 312 rises to within the threshold voltage Vth of transistor 310 of the increased bitline voltage Vbl. In this way, the change of bitline voltage Vbl that occurs as a result of reading memory cell MC is replicated as a change in the voltage on charge reservoir capacitor 312. For example, opening memory cell 102 with a memory cell voltage Vcell of 0.9 volts causes bitline voltage Vbl to rise from a precharge voltage of zero to 0.09 volts. The gate of transistor 310 would thus rise 0.09 volts above the threshold voltage required to turn transistor 310 on. Charge thus transfers through transistor 310 from sense node capacitor 316 to charge reservoir capacitor 312 until the voltage across capacitor 312 increases by 0.09 volts. When this occurs, transistor 310 turns off.

The charge sharing between capacitors 312 and 316 decreases the voltage across sense node capacitor 316 in proportion to the increase in the voltage across charge reservoir capacitor 312. The capacitance Ccr of charge reservoir capacitor 312 is considerably greater than the value of the capacitance Csn of sense node capacitor 316, so the voltage decrease on capacitor 316 is considerably greater than the voltage increase on capacitor 312. In one embodiment, the ratio of the capacitance Csn of capacitor 316 to the capacitance Ccr of capacitor 312 is nominally equal to the ratio of the capacitance Cmc of storage capacitor 305 to that of bitline capacitance Cbl (i.e., Csn/Ccr≈Cmc/Cbl). Another way to characterize this relationship between the capacitances is that the product of capacitances Csn and Cbl equals the product of capacitances Ccr and Cmc (Csn*Cbl=Ccr*Cmc). With this relationship between the capacitances, the voltage amplification between local bitline BL and sense node 314 is approximately the same as the voltage attenuation between memory cell 102 and bitline BL, and the gamut of voltage on sense node 314 is approximately the same as the gamut of cell voltage Vcell. Transistor 310 and capacitors 312 and 316 thus compensate for the voltage attenuation from cell voltage Vcell to bitline voltage Vbl such that the voltage Vsn on sense node 314 replicates the original cell voltage Vcell, and therefore can represent the bit combination originally represented by the cell voltage. The amplification provided by preamplifier Pre0 is inverting, however, so that sense node voltage Vsn is inverted with respect to cell voltage Vcell. In other embodiments, the amplification can be non-inverting and/or the voltage gain provided by transistor 310 and capacitors 312 and 316 can be different.

At 375, signal RD is asserted to turn on transistors 325 and 330. This connects the sources of transistors 315 and 320 to global bitline GBL0. Transistors 315 and 320 pull the global bitline from its pre-charge level toward sense node voltage Vsn. Current supplied by transistors 315 and 320 rapidly charge the global bitline capacitance Cgbl until global bitline voltage Vgbl rises to within the threshold voltage of transistor 315 of the sense node voltage Vsn.

In this embodiment, transistor 315 charges global bitline capacitance Cgbl until global bitline voltage Vgbl rises to within the threshold voltage of transistor 315 of sense node voltage Vsn. Due to its smaller size, transistor 315 charges bitline capacitance Cgbl more slowly than transistor 320. Transistors 315, 320, 325, and 330 thus set global bitline voltage Vgbl to a voltage dependent on the sense voltage Vsn. Global bitline voltage Vgbl is thus set to a level representative of the originally stored cell voltage Vcell. A detailed discussion about an embodiment of preamplifier Pre0 follows in FIGS. 4A, 4B, and 5.

Some embodiments store a single bit per memory cell, rather than multiple bits as discussed above. In such single-bit embodiments, transistor 320 can be connected to ground rather than to supply voltage VDD, and the source of transistor 325 can be connected to ground instead of global bitline voltage GBL through a resistive loading element. In this configuration, preamplifier Pre0 may operate in a non-inverting mode if global bitline GBL is initially precharged to supply voltage VDD, for example, instead of ground. Transistor 320 inverts back the signal previously inverted by transistor 310 and 315 to restore the original signal orientation. In this non-inverting case, instead of using digitizer DG, write circuit W, and data cache DC to decode, to write back, and to alter the data respectively, a single ordinary CMOS sense amplifier can be used to further amplify the one-bit signal detected by preamplifier Pre0, and to write or selectively alter and write the data back into the memory cell MC. This optional single-bit configuration can optimize or save silicon area and largely reduce the data access latency.

FIG. 4A is a schematic diagram further detailing preamplifier Pre0 of FIGS. 1A, 2A and 3A. FIG. 4A additionally depicts a transistor 401 that selectively couples global bitline GBL0 voltage to VDD/2 when a pre-charge signal φGBL_PRE2 is asserted, and a transistor 400 that then selectively couples global bitline GBL0 to supply node GND when a pre-charge signal φGBL_PRE is asserted. Memory cells MC and other like-identified features function in the same manner as the memory cell depicted in FIG. 3A, so a detailed discussion is omitted for brevity.

In addition to the elements described above in connection with FIG. 3A, preamplifier Pre0 is shown to include transistors 405, 410, 415, and 420, and a reverse-biased diode 425. In this example, the capacitance of diode 425 and the gate capacitance of transistor 315 together provide the capacitance Csn of sense node capacitor 316. As discussed in more detail below, the additional transistors and their related control signals are provided both to write cell voltages and to precharge various nodes of preamplifier Pre0 in preparation for reading cell voltage Vcell. The control, supply, and precharge signals are distributed using conductors orthogonal to the local and global bitlines BL and GBL0. Preamplifiers Pre[3:0] (FIG. 2A) can thus be easily arranged in columns to simplify routing and layout. Transistor 405 operates in response to control signal φpre to pre-charge local bitline BL by connecting the local bitline to a source of pre-charge voltage Vpre; transistor 410 operates in response to control signal φref to pre-charge charge reservoir capacitor 312 by connecting capacitor 312 to a source of pre-charge voltage Vbias; and transistor 415 operates in response to control signal RS to pre-charge sense node capacitor 316 by connecting capacitor 316 to supply voltage VDD, as will be described in greater detail below with reference to FIG. 5.

FIG. 4B is a diagram 450 illustrating an example of the relationship between memory cell voltage Vcell, global bitline voltage Vgbl, and write voltage Vw. Write voltage Vw can take one of four values Vw00, Vw01, Vw10, and Vw11 to charge a memory cell to a respective voltage representative of the corresponding one of the four possible bit combinations. To store a voltage representing bit combination 00 in memory cell 102 of FIG. 4A, for example, memory cell 102 is opened by asserting wordline WL0, write voltage Vw00 is applied to global bitline GBL0, and write signal WRT is asserted so that transistor 420 connects global bitline GBL0 to the storage capacitor 305 of memory cell 102.

The highest write voltage Vw00 is set at VDD and represents bit combination 00. Any cell voltage Vcell above ⅚VDD is interpreted by digitizer DG (FIG. 1A) as bit combination 00, so write voltage Vw00 provides an error margin of ⅙VDD. The lowest write voltage Vw11 is set at ground and represents bit combination 11. Any cell voltage Vcell below ⅙VDD is interpreted as bit combination 11, so write voltage Vw11 likewise provides an error margin of ⅙VDD. The two middle write voltages Vw01 and Vw10, ⅔VDD and ⅔VDD, represent bit combinations of 01 and 10, respectively. The ranges of cell voltages Vc01 and Vc10 interpreted as these bit combinations are ⅓ VDD wide and centered on the corresponding write voltages Vw01 and Vw10, and consequently offer error margins of ±⅙VDD. Other relationships are possible and may be used.

Figure 5:
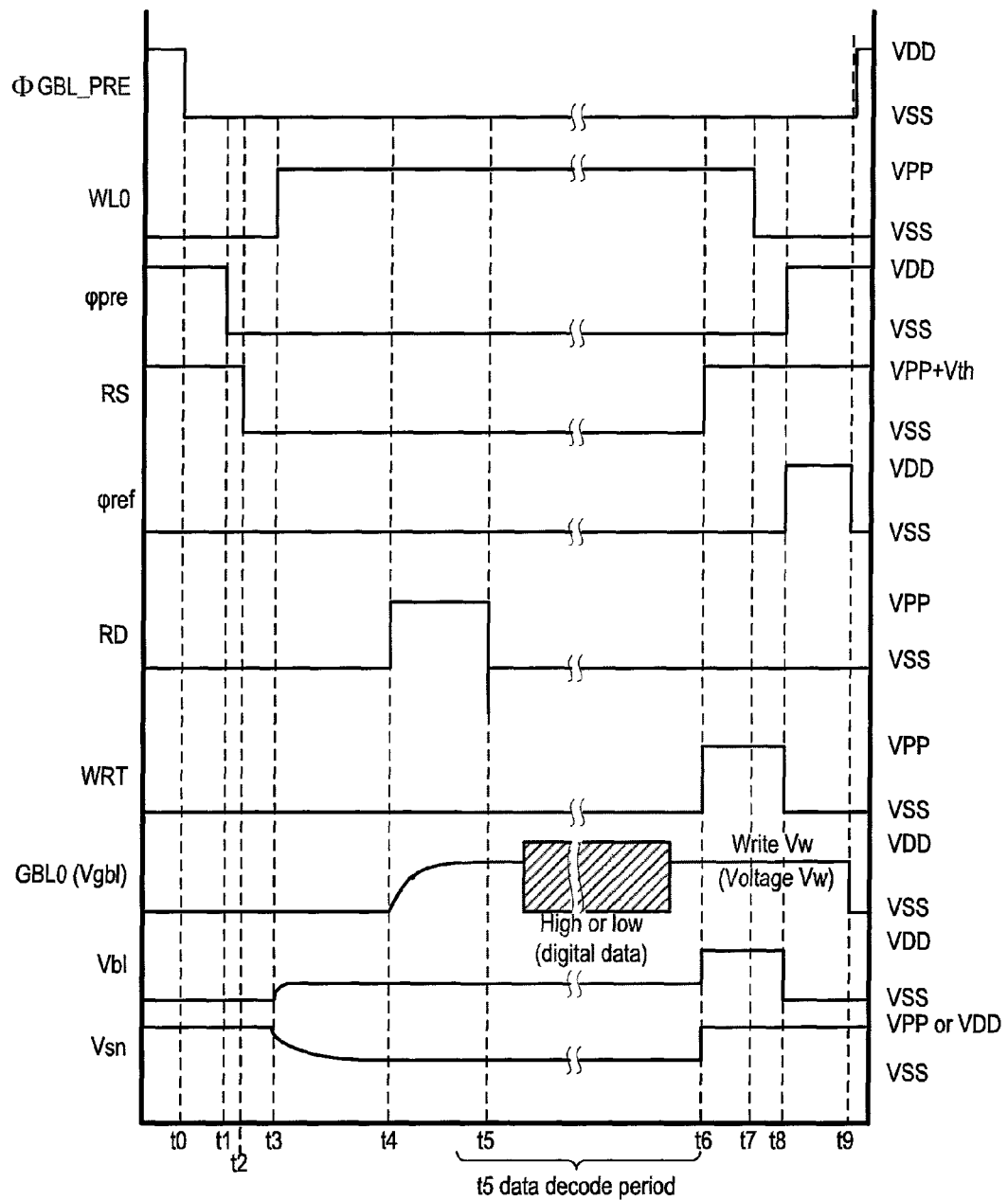
FIG. 5 is a timing diagram depicting the operation of preamplifier Pre0 as depicted in FIG. 4, which operation is identical to that of the other preamplifiers.

FIG. 5 is a timing diagram depicting an example of the operation of preamplifier Pre0 depicted in FIG. 4A, which operation is identical to that of the other preamplifiers. The names of the signals depicted in the timing diagram of FIG. 5 correspond to like-named nodes in FIG. 4A. In connection with this and other figures, nodes and the corresponding signals are identified using the same designations. Whether a specific reference is to a signal or a corresponding node will be clear in context.

Prior to the operational sequence to be described, global bitline GBL0 is held at ground by global pre-charge signal φGBL_PRE applied to transistor 400, local bitline BL is held at its pre-charge voltage Vpre by transistor 405; charge reservoir capacitor 312 is floating after being disconnected from its pre-charge voltage Vbias; and sense node capacitor 316 is held at its pre-charge voltage VDD by transistor 415. From left to right, at time t0, the global pre-charge signal φGBL_PRE is de-asserted (brought to a voltage representative of a logic zero). This allows global bitline GBL0 to float at its pre-charged value, which is ground potential in this example (source voltage VSS is at ground potential). At time t1, pre-charge signal φpre is likewise de-asserted to allow local bitline BL to float at its pre-charge voltage Vpre, also zero volts in this case. In the final interval of releasing the nodes from their pre-charge conditions, signal RS to transistor 415 is de-asserted at time t2 to disconnect sense node capacitor 316 from a pre-charge voltage (supply voltage VDD in the example shown) that is high relative to voltage Vpre. Alternatively, one or both of signals φpre and RS can be de-asserted at time t0. Preamplifier Pre0 is now in condition to amplify the change in bitline voltage Vbl that occurs when memory cell 102 or another of the memory cells MC is connected thereto. In one embodiment precharge voltage Vpre is VPP, the sum of supply voltage VDD and the threshold voltage Vth of the NMOS transistors of FIG. 4A (VPP=VDD+Vth).

At t3, one of the word-line signals is asserted to connect a page of memory cells to their respective local bitlines BL. In the example of FIGS. 4A and 5, wordline WL0 is asserted at time t3 and the respective memory cell 102 is storing a positive cell voltage Vcell. Bitline voltage Vbl applied to the gate of transistor 310 thus begins to rise at time t3 as a result of charge sharing between the storage capacitor 305 of the selected memory cell 102 and the bitline capacitance Cbl of local bitline BL. Capacitors 316 and 312 are precharged high and low, respectively, so turning on transistor 310 allows charge to move from capacitor 316 to capacitor 312. This causes sense node voltage Vsn on sense node 314 to fall towards the voltage Vbias on charge reservoir capacitor 312, also at time t3. As noted previously in connection with FIG. 3A, the capacitance Ccr of capacitor 312 is greater than the capacitance Csn of capacitor 316, so the voltage drop on sense node Vsn is greater than the voltage rise on capacitor 312 and the voltage rise on bitline BL. Preamplifier Pre0 thus compensates for the attenuation of voltage Vcell due to the charge sharing between the memory cell and the local bitline. The voltage change Vsn on sense node 314 depends upon the stored cell voltage Vcell, so sense voltage Vsn preserves the information represented by cell voltage Vcell.

Signal RD is asserted at time t4. The voltage applied at node RD is VPP, the same voltage applied to wordline WL to turn on transistor 300. VPP can be the sum of supply voltage VDD and the threshold voltage of the NMOS transistors of FIG. 3A, and is used to overcome the threshold drop imposed by the NMOS transistors. Activating transistors 330 and 325 couple transistors 315 and 320 to global bitline GBL0 so that transistors 315 and 320 pull global bitline GBL0 toward sense node voltage Vsn. Eventually as the voltage Vgbl approaches sense node voltage Vsn, transistor 320 will shut down naturally which leaves transistor 315 only turned on and setting Vgbl close to Vsn.

Global bitline GBL0 is decoupled from preamplifier Pre0 at time t5 and left floating at a level of global bitline voltage Vgbl representative of the cell voltage Vcell of memory cell 102. While not evident in FIG. 5, digitizer DG0 (FIG. 2A) converts the analog global bitline voltage Vgbl to the MSB and LSB of a two-bit combination, identical to the two-bit combination represented by write voltage Vw originally stored in the open memory cell 102. The process of converting global bitline voltage Vgbl to the MSB and LSB of a two-bit combination is detailed below for embodiments of digitizer DG0.

Reading memory cell 102 depletes the charge stored therein. The memory cell voltage Vcell is therefore refreshed after the memory cell has been read. Alternatively, in the case of a write access, a cell voltage Vcell representing new data is imposed on the memory cell. The refresh or write data is represented by a write voltage Vw conveyed to the memory cell by global bitline GBL0, a transistor switching element 420, and local bitline BL. The write voltage is imposed on global bitline GBL before time t6, either to refresh the original cell voltage or to write a new cell voltage representing a new bit combination. Optionally, although it is not shown in FIG. 4A, the source of transistor 400 can be connected to ground voltage indirectly through a resistive loading element. With this circuit configuration signal ΦGBL_PRE can remain asserted until time t5F, which is the timing shown in FIG. 9. At time t5F signal ΦGBL_PRE can be de-asserted to an electrically floating position. This option may increase power consumption by having direct current flow between VDD and ground through transistors 315, 320. 325, 330, and 400 with the resistive load element, but advantageously increases immunity to coupling noise generated by switching of global bitlines GBL and to parasitic capacitive coupling of adjacent global bitlines GBL.

Signals RS and WRT are both asserted at time t6. Signal RS is brought one threshold voltage Vth above VPP, which causes transistor 415 to charge sense node 314 to its precharge voltage VPP. Precharging sense node 314 to VPP allows transistor 315 to pull the gate of transistor 320 as high as VDD. Asserting signal WRT causes transistor 420 to connect global bitline GBL0 to local bitline BL. As a consequence, local bitline BL rises to the write voltage Vw on global bitline GBL0. Wordline WL0 is still open at time t6, so the write voltage on bitline BL charges the storage capacitor 305 in the memory cell.

Wordline WL0 then closes at time t7, leaving memory cell 102 with write voltage Vw stored therein as a new or refreshed cell voltage Vcell. At time t8, signal WRT is de-asserted to decouple the local and global bitlines, and signals φref and φpre are asserted to return charge reservoir capacitor 312 (FIG. 4A) and local bitline voltage Vbl to their respective precharge levels. Finally, at time t9, pre-charge signal ΦGBL_PRE is asserted to return global bitline GBL to its pre-charge level, and signal φref is deasserted to allow local bitline BL to float in anticipation of another memory-cell access. Optionally, signal φref can remain asserted at time t9 provided that it is deasserted at time t0. Use of this option fixes the capacitance Ccr to bias voltage Vbias initially and may be used with the Vbias calibration method as described in FIGS. 16 and 17. Other ways of operating preamplifier Pre0 and the remaining preamplifiers are possible and may be used.

Figure 6:
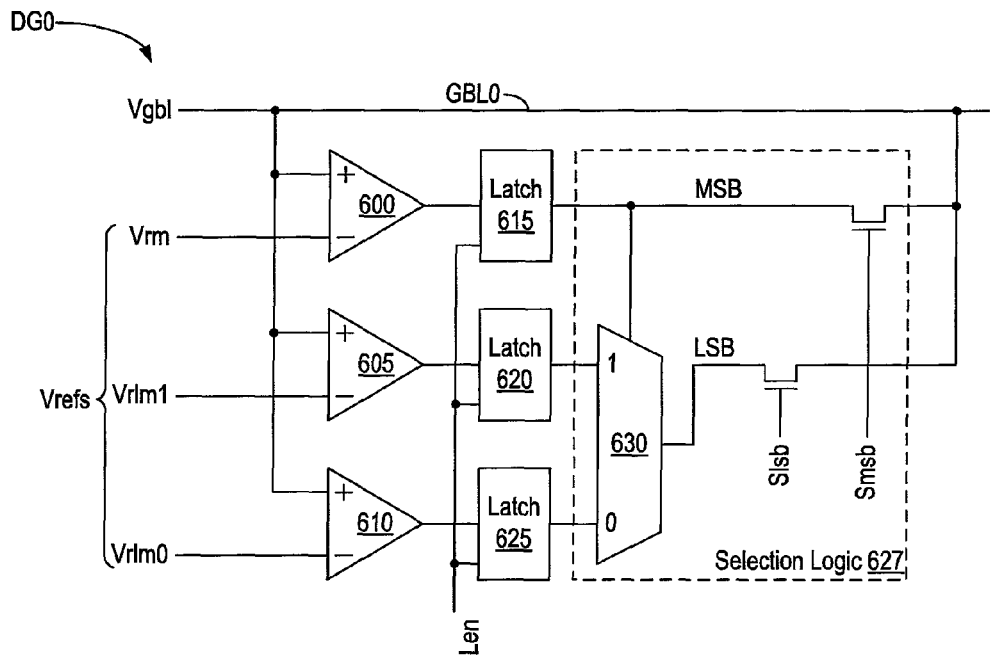
FIG. 6 depicts an embodiment of a digitizer DG0 of FIG. 2A, which may be identical to digitizers DG[3:1].

FIG. 6 depicts an example of an embodiment of a digitizer DG0 of FIG. 2A, which may be identical to digitizers DG[3:1]. During each read or refresh operation, three comparators 600, 605, and 610 compare the global bitline voltage Vgbl on global bitline GBL0 to each of three reference voltages Vrm, Vrlm1, and Vrlm0 (collectively Vrefs). In one embodiment, the comparisons are performed simultaneously. Latches 615, 620, and 625 latch the outputs of the respective comparators 600, 605, and 610 when an enable signal Len is asserted. Latch 615 latches a value representative of the MSB, and selection logic 627 uses the latched MSB to select the LSB from latch 620 or latch 625. Selection logic 627 sequentially imposes the MSB and LSB, respectively, as digital values, on global bitline GBL0 responsive to control signals Smsb and Slsb. Transistors 325 and 330 in preamplifier Pre0 (FIG. 3A) and the remaining preamplifiers are deactivated before the MSB and LSB are imposed on the global bitline so imposing the digital values on the global bitline does not result in a signal conflict.

Figure 7A:
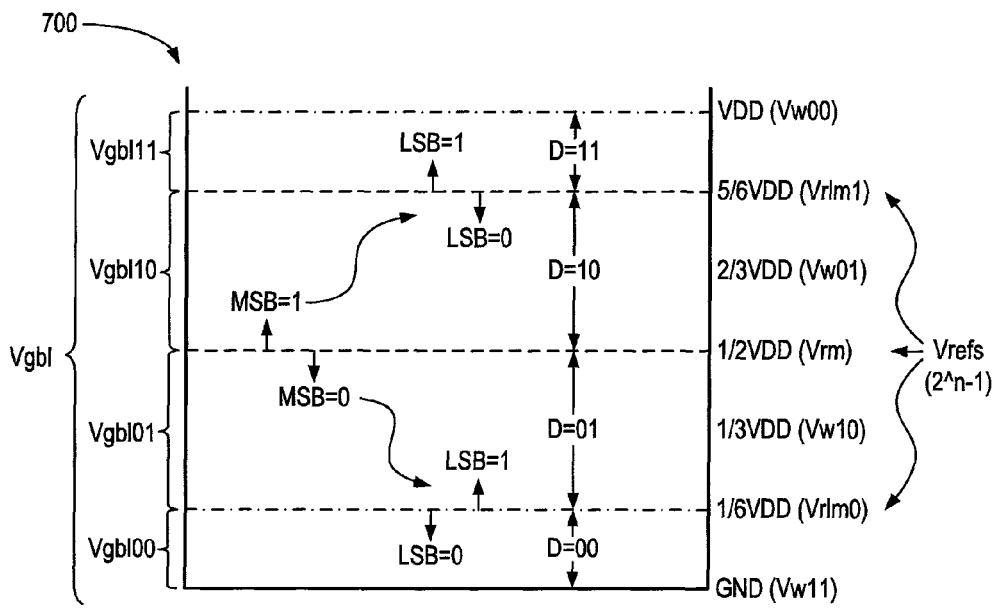
FIG. 7A is a level diagram 700 depicting the operation of digitizer DG0 of FIG. 6.

FIG. 7A is a level diagram 700 depicting the operation of digitizer DG0 of FIG. 6. At the left of diagram 700 is shown the gamut of global bitline voltage Vgbl from ground to supply voltage VDD. The gamut is broken into four ranges, one for each two-bit combination from 00 to 11. The right-hand side of diagram 700 shows the values of reference voltages Vlr0, Vrm, and Vrlm0 and write voltages Vw11, Vw10, Vw01, and Vw00 as fractions of supply voltage VDD. The reference voltages correspond to the boundaries between the ranges of global bitline voltage Vgbl, and are used to relate the voltage ranges and the respective bit combinations they represent. In practice, the reference and write voltages are typically determined empirically to accommodate, e.g., process, temperature, and supply-voltage variability.

With reference to FIG. 6, assume, for example, that global bitline GBL0 presents a global bitline voltage Vgbl between Vrm and Vrlm0, which is within the range Vgbl01. Because voltage Vgbl is greater than reference voltage Vrlm0 and less than reference voltages Vrlm1 and Vrm, latch 625 will output a logic one and latches 615 and 620 will each output a logic zero. The logic zero in latch 615 represents the MSB, and causes a multiplexer 630 in selection logic 627 to select the output of latch 625—a logic one—for the LSB. Selection logic 627 will therefore output the MSB and LSB of bit combination 01. The control signals Smsb and Slsb sequentially asserted respectively cause digitizer DG0 to impose the MSB and LSB sequentially on the global bitline GBL0. Other digitizer embodiments are possible and may be used.

The charge leakage that necessitates refreshing stored cell voltages in dynamic memory cells varies with stored voltage. The precise relationship between stored voltage and leakage current is complex, as there are multiple leakage paths that individually and collectively vary with process, temperature, and supply voltage. To a first approximation, however, the leakage current is proportional to the square of the voltage across the access transistor. The non-linear relationship between leakage current and stored voltage can reduce the error margins for higher cell voltages compared with those for lower cell voltages. In the case of FIG. 7A, for example, a stored voltage VDD (Vw11) representing bit combination 11 is likely to fall below reference voltage ⅚VDD (Vrlm1)—and thus produce an error—more quickly than a stored voltage ⅔VDD (Vw10) representing bit combination 10 is likely to fall below reference voltage ½VDD (Vrm).

Figure 7B:
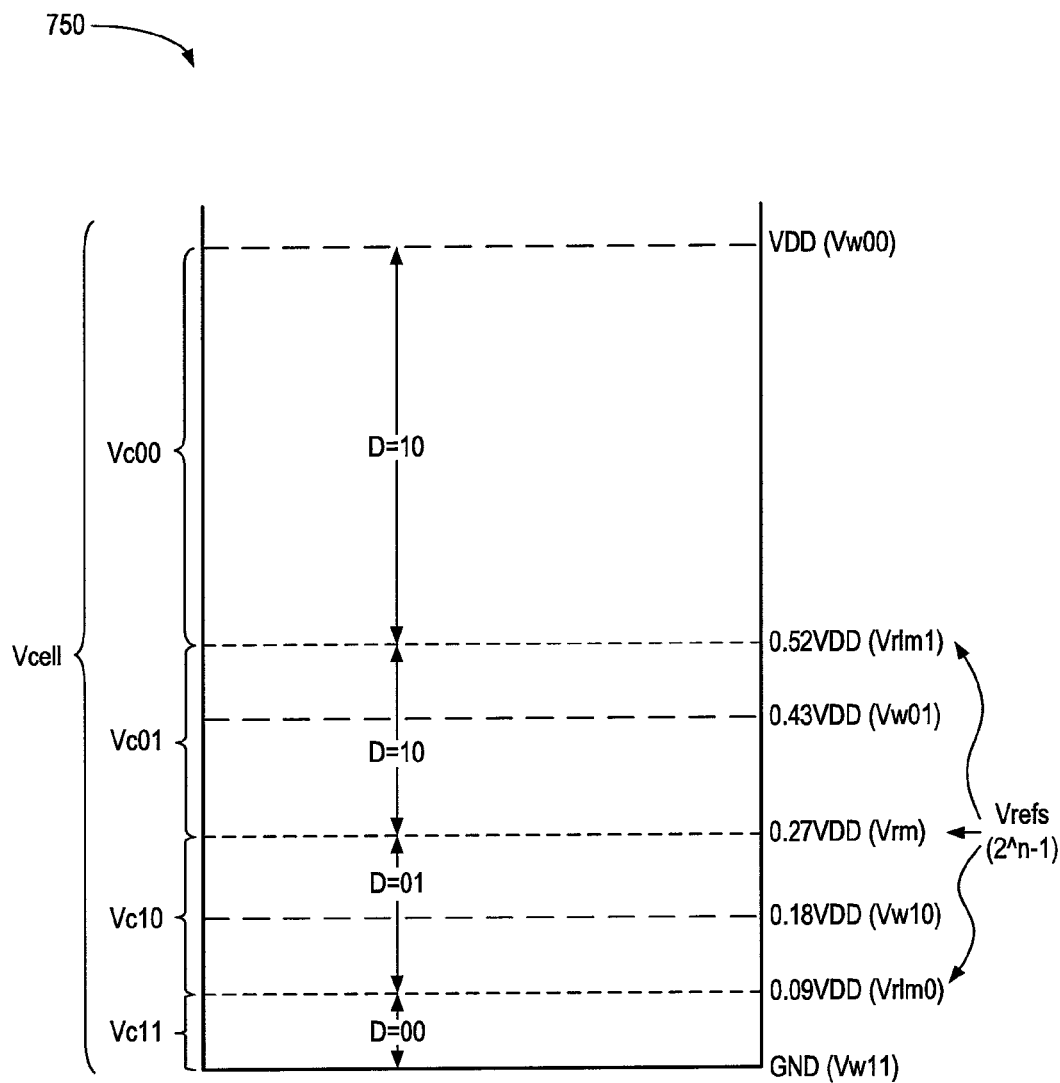
FIG. 7B is a level diagram 750 similar to diagram 700 of FIG. 7A but showing how the reference and write voltages can be distributed non-linearly to improve overall error margins for an embodiment in which the memory cell capacitors are referenced to ground potential and can be charged to from ground to VDD.

FIG. 7B is a level diagram 750 similar to diagram 700 of FIG. 7A but showing an example of how the reference and write voltages can be distributed non-linearly to improve overall error margins for an embodiment in which the memory cell capacitors are referenced to ground potential and can be charged to from ground to VDD.

Memory-cell leakage occurs primarily through the source/drain junctions of the access transistor to the device substrate. The higher the stored voltage, the higher the rate of leakage. Higher stored voltages will therefore degrade more than lower stored voltages between periodic refresh transactions, leaving higher stored voltages with lower error margins. The write voltages and reference voltages can be distributed in a manner that provides the best overall voltage margins for a given configuration. In the example of FIG. 7B, the reference voltages are distributed to accommodate greater voltage drift in higher voltage ranges than in lower voltage ranges. Cell voltage Vcell, when written with the highest write voltage Vw11 to represent bit combination 11, can fall to nearly 50% of its original level without being misinterpreted.

With reference to FIG. 3A, if memory cell MC and preamplifier Pre0 were modified to support the nonlinear voltage levels of FIG. 7B, then the highest output voltage from preamplifier Pre0 need not exceed about 0.61 VDD. The gain of preamplifier Pre0 might therefore be increased by a factor of 1/0.61=1.64. The upper 0.4VDD of the gamut of cell voltage Vcell can be used to improve signal detection. For example, expressed in units of VDD, the worst-case margin between the nominal "01" level=0.18 and R0=0.09 is 0.18−0.09=0.09. Multiplying this by 1.64 gives 0.09*0.18=0.15. The digitizers, detailed later in connection with, e.g., FIGS. 6 and 8, may be modified to accommodate the non-linear reference levels. Methods of empirically determining optimum reference voltages are discussed below.

FIG. 8A shows an example of a detailed embodiment of a digitizer DG0 of FIG. 2A, which is identical to digitizers DG[3:1] in this example. Digitizer DG0 includes three separate sense amplifiers 800, 805, and 810, one for each of the three reference-voltage levels Vrlm0, Vrm, and Vrlm1 (see e.g., FIGS. 7A and 7B). Each of the separate sense amplifiers 800, 805, and 810 in turn includes a pre-charge transistor 815, an access transistor 820, latch 825, and a pair of capacitors Crs and Cms. These elements each receive two analog signals and output a bit whose state depends on a level relationship between the analog signals.

Sense amplifiers 800 and 810 are for sensing the LSB, and additionally include transistors 830 and 835. In addition to the aforementioned reference voltages, individually named Vrlm0, Vrm, and Vrlm1, digitizer DG0 receives control signals Mctr from control logic 240 of FIG. 2A. Exceptions are signals ΦGBL_PRE and ΦGBL_PRE2, which control respective transistors 400 and 401 to precharge global bitline GBL0 to ground and VDD/2, respectively. Transistors 400 and 401 are not part of digitizer DG0, but are shown in FIGS. 4A and 8A to help illustrate the operations of preamplifier Pre0 and digitizer DG0.

FIG. 8B depicts an embodiment of latch 825 in sense amplifier 805 of FIG. 8A. The other latches 825 are structurally identical. When control signal ΦISO is asserted, input nodes 827 and 829 are coupled to the input terminals of a pair of cross-coupled inverters. When each latch is enabled, global bitline voltage Vgbl is received as voltage Vmsb, Vlsb0 and Vlsb1, respectively. Asserting signals SAP and SAN high and low, respectively, causes latch 825 to compare the voltages Vrm and Vmsb on nodes 827 and 829, respectively, and latch the result. If the voltage Vmsb on node 829 is greater than the reference voltage Vrm on node 827, for example, the inverters will drive the voltages Vmsb and Vrm on nodes 829 and 827, respectively, to the respective high and low voltages on nodes SAP and SAN.

Figure 9:
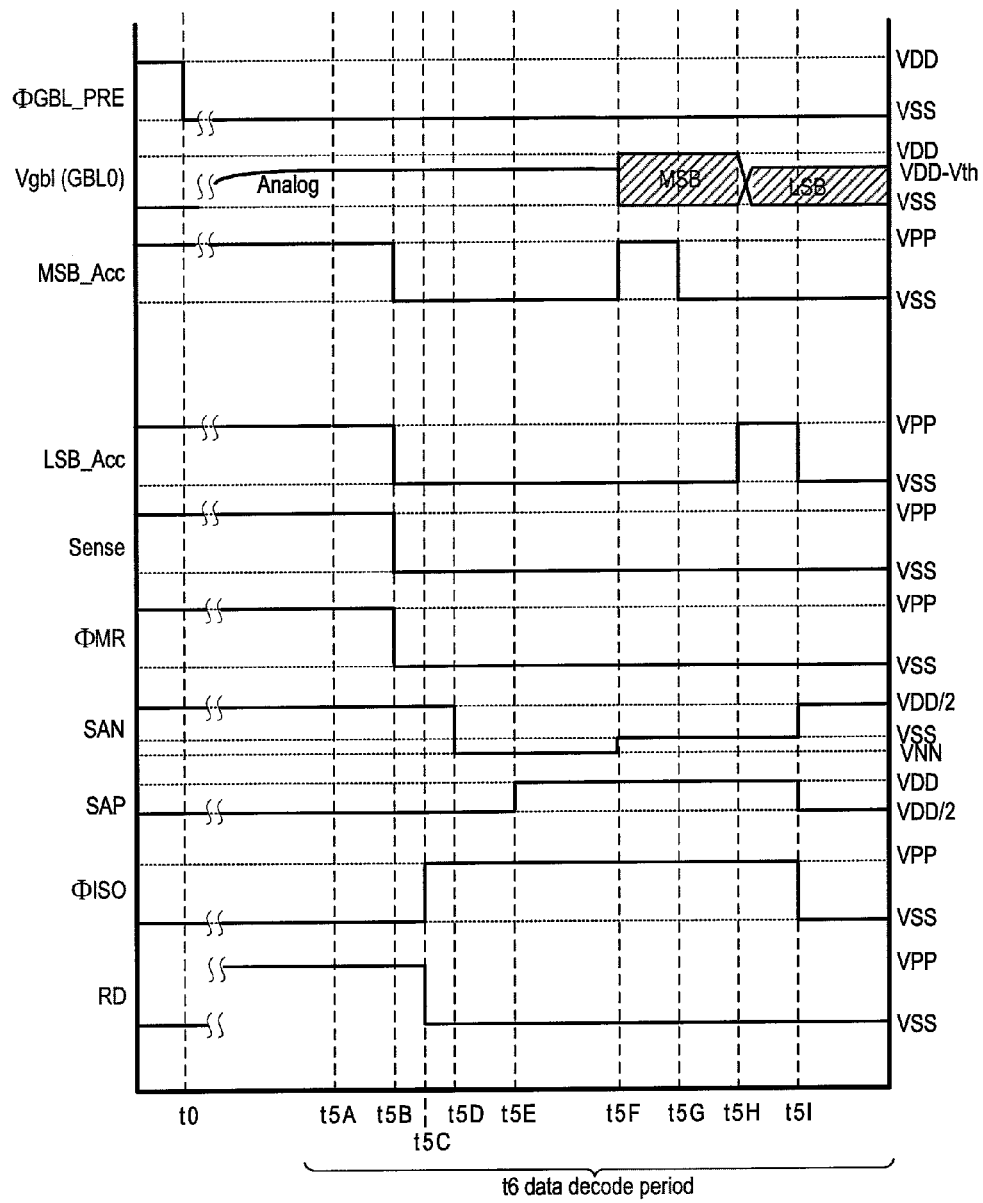
FIG. 9 is a timing diagram depicting the operation of digitizer DG0 of FIG. 8.

FIG. 9 is a timing diagram depicting the operation of digitizer DG0 of FIGS. 8A and 8B. The names of the signals depicted in FIG. 9 correspond to like-identified signals shown in FIGS. 8A and 8B. The time axis of FIG. 9 is the same as that of FIG. 5. Digitizer DG0 does not operate until after time t5, at which time global bitline voltage Vgbl derived from the contents of a memory cell is present on global bitline GBL0. The reader is directed to the FIG. 5 and the associated description of times t0 to t5. The interval labeled t5 data decode period in FIG. 5 is divided into times t5A-t5I in FIG. 9.

As of time t5A, signals MSB_Acc, LSB_Acc, Sense, and ΦMR are asserted, complementary signals SAP/SAN are deasserted, and global bitline voltage Vgbl on the global bitline GBL0 has had time to settle at a voltage representative of voltage Vcell in the accessed memory cell. Signals MSB_Acc and LSB_Acc enable transistors 820, and signal Sense enables transistors 830. The global bitline voltage Vgbl on global bitline GBL0 is thus conveyed to the respective sense node 829 of each of sense amplifiers 800, 805, and 810. Signal ΦMR likewise causes transistors 815 to connect the reference node 827 of each of sense amplifiers 800, 805, and 810 to a respective one of reference voltages Vrlm0, Vrm, and Vrlm1. Each latch 825 is thus presented with a reference voltage on input node 827 and voltage Vgbl on input node 829.

Each of sense amplifiers 800, 805, and 810 of FIG. 8A works essentially the same way. Referring to the sense amplifier 800, signals LSB_Acc, Sense, and ΦMR are deasserted at time t5B to capture lowest reference voltage Vrlm0 on capacitor Crs and the global bitline voltage Vgbl as voltage Vlsb0 on capacitor Cms. The reference voltage and global bitline voltage Vgbl are thus saved at the inputs 827 and 829 of latch 825 for comparison. At time t5C signal ΦISO is asserted to present the two voltages to the inputs of the pair of cross-coupled inverters (FIG. 8B). At the same time, signal RD (FIG. 4A) is deasserted to decouple global bitline GBL0 from preamplifier Pre0, and consequently to prepare global bitline GBL0 to receive the MSB and LSB of the bit combination output by digitizer DG0.

Still referring to sense amplifier 800 of FIG. 8A, signals SAN and SAP to latch 825 are asserted at respective times t5D and t5E to power latches 825. The latch 825 in sense amplifier 800 thereafter compares the global bitline voltage Vgbl captured on capacitor Cms to reference voltage Vrhn0 and stores the result of the comparison by driving the input at the higher level to the level of signal SAP (e.g., VDD) and the input at the lower level to the level of signal SAN (e.g., VNN). Voltage VNN may be set below ground in embodiments in which the NMOS transistors of latches 825 exhibit relatively high threshold voltages. Voltage VNN is commonly used to overcome the threshold drop imposed by the NMOS transistors. Latch 825 in sense amplifier 800 thereafter stores a bit whose state indicates whether the global bitline voltage Vgbl is above or below lowest reference voltage Vrlm0.

Sense amplifier 810 of FIG. 8A works identically to sense amplifier 800 and is responsive to the same control signals. Sense amplifier 810 differs, however, in that the reference voltage compared with global bitline voltage Vgbl is the highest reference voltage Vrlm1. Latch 825 in sense amplifier 810 thus stores a bit whose state indicates whether the global bitline voltage Vgbl is above or below reference voltage Vrlm1.

Sense amplifier 805 of FIG. 8A is almost identical to sense amplifiers 800 and 810, but receives a control signal MSB_Acc in lieu of LSB_Acc. Sense amplifier 805 stores a digital bit whose state represents whether the global bitline voltage Vgbl is above or below reference voltage Vrm. With reference to FIG. 7A, reference voltage Vrm is the middle reference voltage, and determines the state of the MSB of the bit combination represented by the global bitline voltage Vgbl. The MSB value stored in sense amplifier 805 controls transistors 835 in each of sense amplifiers 800 and 810, and thus determines whether the LSB will be read from sense amplifier 800 or sense amplifier 810. This LSB selection is discussed in greater detail below.

Returning to FIG. 9, at time t5F, signal MSB_Acc is asserted to connect node Vmsb to global bitline GBL0. Signal SAN may also be raised from VNN to VSS, the latter of which may be a more stable and universal voltage level on a memory device. Sense amplifier 805 imposes a relatively high voltage representing an MSB of one or a relatively low voltage representing an MSB of zero on global bitline GBL0. Though not shown, the MSB is then captured at time t5G by data cache DC (FIG. 1A) or cache/write circuit DC/W0 (FIG. 2A). Signal MSB_Acc is also disabled at time t5G to decouple sense amplifier 805 from global bitline GBL0.

At time t5H signal LSB_Acc is asserted to turn on a respective transistor 820 in each of the LSB sense amplifiers 800 and 810. Only one of nodes 827 and 829 is high in sense amplifier 805, so transistor 835 in only one of sense amplifiers 800 and 810 is turned on. Asserting signal LSB_Acc to transistors 820 thus applies the output from only one of LSB sense amplifiers 800 and 810 to global bitline GBL0. Assuming sense amplifier 805 has sensed a logic-one MSB, for example, a high value on node Vmsb causes sense amplifier 810 to impose the LSB on global bitline GBL0. The LSB is captured by data cache DC (FIG. 1A) or cache/write circuit DC/W0 (FIG. 2A) and signal LSB_Acc deasserted at time t5I. The high state of the LSB on global bitline GBL0 does not rise all the way to VDD due to an extra threshold drop caused by the series connection of transistors 820 and 835. Caching the LSB in data cache DC or cache/write circuit DC/W0 restores the LSB to its full range.

Signals SAN, SAP, and ΦISO are deasserted at time t5I to disable latches 825. At this point the analog global bitline voltage presented to digitizer DG0 has been converted to a bit combination and the MSB and LSB of the bit combination have been sequentially loaded into a data cache. What follows is the write operation described above in connection with FIGS. 4A and 5.

Figure 10:
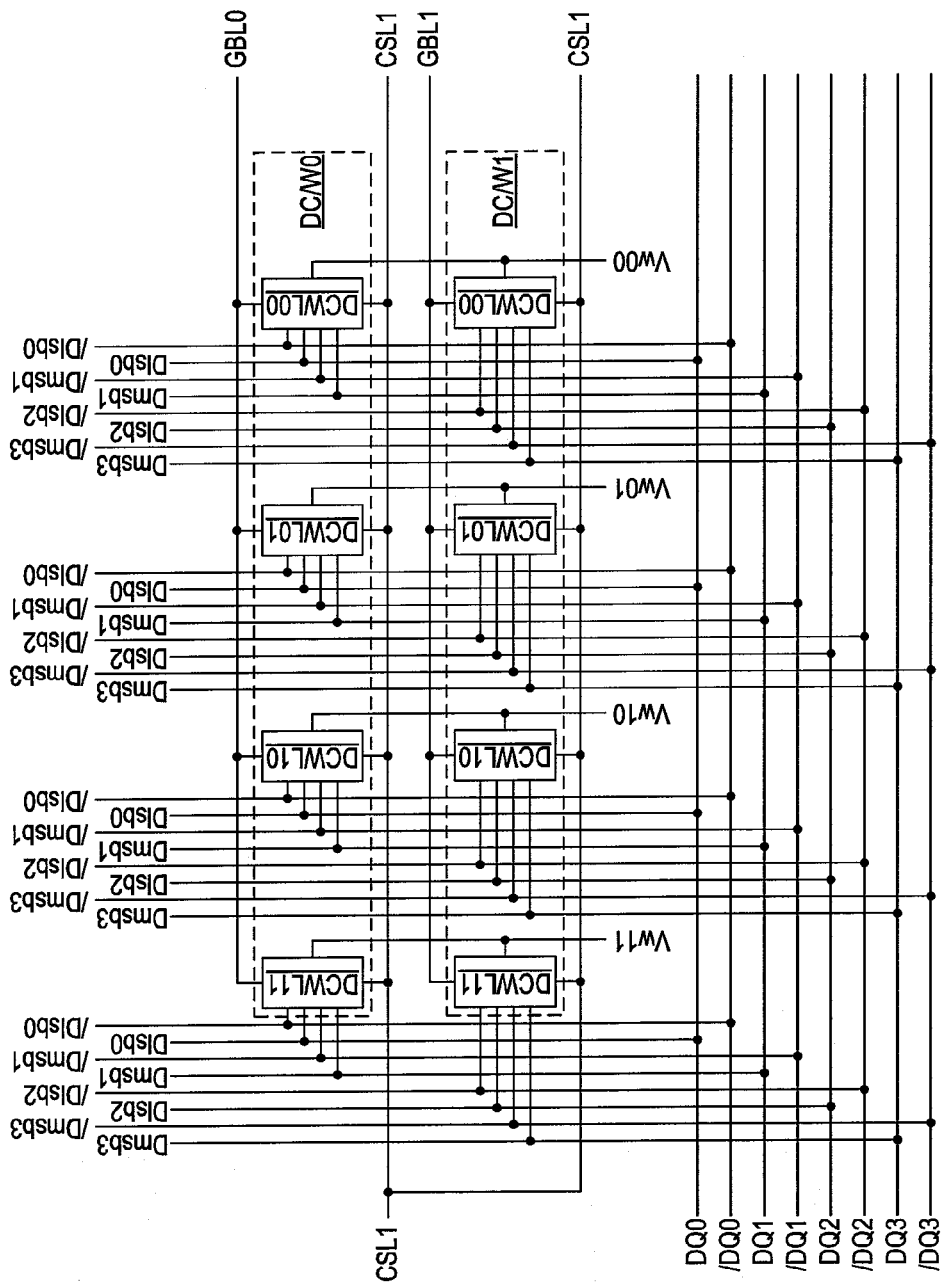
FIG. 10 illustrates how the data cache/write circuits DC/W0 and DC/W1 of FIG. 2A are connected to respective global bitlines GBL[1:0] and data-line pairs DQ[3:0] in accordance with one embodiment.

FIG. 10 illustrates how the data cache/write circuits DC/W0 and DC/W1 of FIG. 2A are connected to respective global bitlines GBL[1:0] and data-line pairs DQ[3:0] in accordance with one embodiment. In their roles as data caches, each of data cache/write circuits DC/W0 and DC/W1 stores a respective bit combination composed of two bits. With reference to data cache/write circuit DC/W0, the two bits are replicated in each of four blocks labeled DCWL00, DCWL01, DCWL10, and DCWL11 to identify their dual use as data caches and write logic. Local line pairs Dmsb1-/Dmsb1 and Dlsb0-/Dlsb0 extending from data cache/write circuit DC/W0 carrying like-named signal pairs, carry the bit combination read from a memory cell via digitizer DG0 of the same column, or the new bit combination to be written to the memory cell, as detailed previously.

Blocks DCWL00, DCWL01, DCWL10, and DCWL11 in data cache/write circuit DC/W0 are each supplied with a respective write voltage Vw11, Vw10, Vw01, and Vw00 (collectively write voltages Vw), which, in the example shown, is generated using a respective voltage source (not shown) common to all data cache/write circuits. Depending upon the stored bit combination, only one of the blocks couples its write voltage to global bitline GBL0. For example, if the bit combination stored in data cache/write circuit DC/W0 is 11, then block DCWL11 in data cache/write circuit DC/W0 imposes write voltage Vw11 on global bitline GBL0. Write voltage Vw11, which represents bit combination 11, is then conveyed to the addressed memory cell via global bitline GBL0, transistor 420 and local bitline BL in the manner detailed above. Similarly, each of blocks DCWL00, DCWL01, and DCWL10 in data cache/write circuit DC/W0 applies a respective write voltage Vw10, Vw01, or Vw00 to global bitline GBL based upon the respective value of the stored bit combination.

Local line pairs Dlsb0-/Dlsb0 and Dlsb1-/Dlsb1 carrying like-named signal pairs are connected to respective data lines DQ0-/DQ0 and DQ1-/DQ1 so that data can be communicated to and from data cache/write circuit DC/W0 via the data lines (FIG. 2A) when column select signal CSL1 is asserted. Data cache/write circuit DC/W1 is similar to data cache/write circuit DC/W0, but stores a different bit combination in its four blocks DCWL11, DCWL10, DCWL01, and DCWL00. Local line pairs Dmsb3-/Dmsb3 and Dlsb2-/Dlsb2 carrying like-named signal pairs, carry a respective bit combination read from a memory cell via digitizer DG1 in the same column, or a new bit combination to be written to the memory cell. Local line pairs Dlsb3-/Dlsb3 and Dlsb2-/Dlsb2 are connected to respective data line pairs DQ3-/DQ3 and DQ2-/DQ2 so that data can be communicated to and from data cache/write circuit DC/W1 via the data lines when column select signal CSL1 is asserted. Data cache/write circuits DC/W2 and DC/W3 (FIG. 2A) are identical, and are similarly connected to data-line pairs DQ[7:4] to communicate four more bits. Each selected column can therefore communicate eight bits—two for each accessed memory cell—on data line pairs DQ[7:0].

FIGS. 11A through 11D detail an example of the four blocks DCWL11, DCWL10, DCWL01, and DCWL00 that collectively form the data cache/write circuit DC/W0 connected to the highlighted global bitline GBL0 of FIG. 2A and FIG. 10 in accordance with one embodiment. The other data cache/write circuits can be identical. As noted previously in connection with FIG. 10, each block in the set of blocks stores the same bit combination read from one memory cell and/or to be written to a memory cell.

Figure 11C:
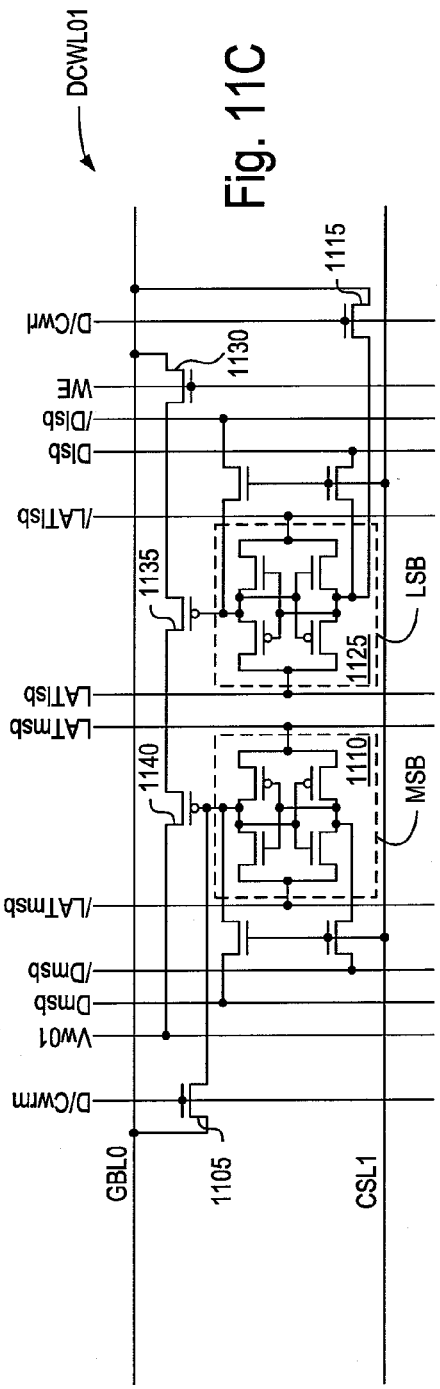
Figure 11D:
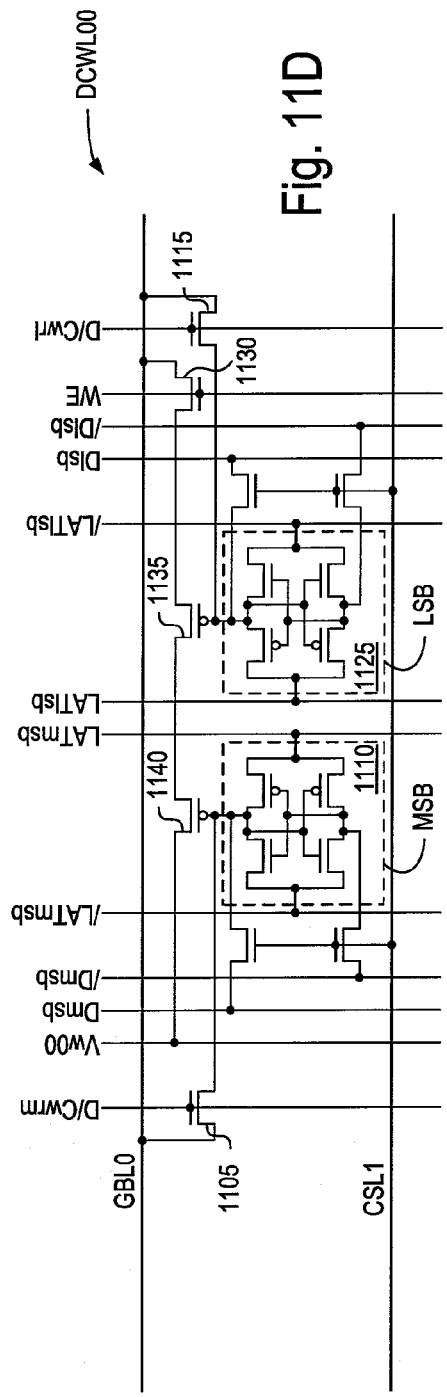

With reference to FIG. 11A, a pair of latches 1110 and 1125 stores the MSB and LSB, respectively, and can be considered as constituting the data cache portion of block DCWL11. The contents of latches 1110 and 1125 control a pair of transistors 1140 and 1135 to selectively connect write voltage Vw11 to global bitline GBL0 when a write-enable signal WE is asserted. Transistors 1140 and 1135 can be considered the write-logic portion of block DCWL11. This data caching and write-logic functionality are detailed below. The remaining blocks shown in FIGS. 11B-11D are structurally similar but differ in their internal logic such that each block requires a different combination of MSB and LSB to cause the block to connect the respective write voltage received by the block to global bit line GBL0.

Figure 12:
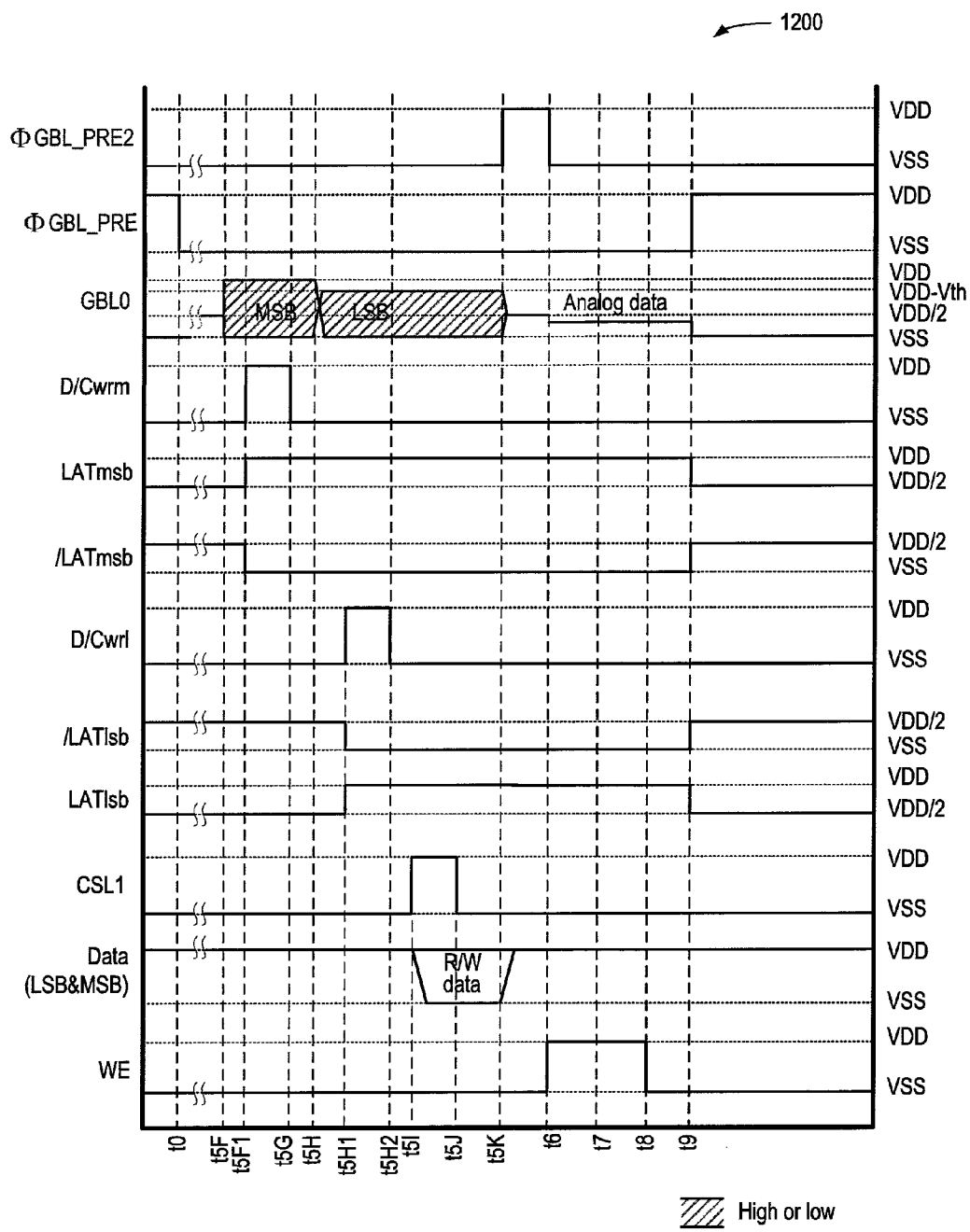
FIG. 12 is a timing diagram 1200 depicting the operation of data cache/write circuit DC/W0 of FIGS. 10 and 11A-D.

FIG. 12 is a timing diagram 1200 depicting the operation of data cache/write circuit DC/W0 of FIGS. 10 and 11A-11D. The time axis of FIG. 12 is the same as those of FIGS. 5 and 9, beginning with time t0 when signal ΦGBL_PRE is deasserted. Data cache and write circuit DC/W0 does not capture data from the global bitline until after time t5F, the time at which digitizer DG0 presents the MSB on global bitline GBL0.

With reference to FIG. 11A, signal D/Cwrm and signals LATmsb and /LATmsb are asserted at time t5F1, between times t5F and t5G. Asserting signal D/Cwrm causes a transistor 1105 to connect global bitline GBL0 to an input node of MSB latch 1110; asserting signals LATmsb and /LATmsb enables latch 1110 to capture the MSB from global bitline GBL0. When signal D/Cwrm is then deasserted at time t5G, latch 1110 contains the MSB.

Next, at time t5H1, between time t5H and t5I, signal D/Cwrl and signals LATlsb and /LATlsb are asserted. Asserting signal D/Cwrl causes a transistor 1115 to connect global bitline GBL0 to an input node of LSB latch 1125; asserting signals LATlsb and /LATlsb enables latch 1125 to capture the LSB from the global bitline. When signal D/Cwrl is then deasserted at time t5H2, between time t5H1 and t5J, latch 1125 contains the LSB. The remaining latch pairs of FIGS. 11B-11D work the same way and in parallel, so that, by time t5J, each latch pair stores the MSB in latch 1110 and the LSB in latch 1125. The write logic associated with each of the remaining latch pairs differs, however, such that each of blocks DCWL11, DCWL10, DCWL01, and DCWL00 imposes a respective write-back voltage on the global bit line responsive to just one of the four possible bit combinations.

The type of data-access operation determines what happens after the bit combination read from a memory cell is stored in each pair of latches 1110 and 1125. For read or write operations, column-select signal CSL1 is asserted at time t5I to present the MSB as complementary signals on local line pair Dmsb-/Dmsb and the LSB as complementary signals on local line pair Dlsb-/Dlsb. The complementary local line pairs that convey the MSB and LSB are connected to respective pairs of data lines, such as those labeled DQ in FIG. 2A. For example, in FIG. 10, local line pairs Dmsb-/Dmsb and Dlsb-/Dlsb from a selected row and column can impose two complementary signals on data lines DQ0-/DQ0 and DQ1-/DQ1. The data lines then convey the MSB and LSB to data amplifier 220 and DQ buffer 225 (FIG. 2) to be output from MLDRAM 200. In write operations, a new bit combination received from data amplifier 220 overwrites the contents of latches 1110 and 1125. In both read operations and write operations, column select signal CSL1 is deasserted at time t5J, which leaves latches 1110 and 1125 storing whatever bit combination is to be written to the memory cell.

Precharge signal ΦGBL_PRE2 is asserted at t5K to precharge global bitline GBL0 to VDD/2 (this precharge circuitry is depicted in FIGS. 4A and 8A). Precharging global bitline GBL0 to VDD/2 is not needed when the write voltage is VDD or ground, but may be required to accommodate the threshold voltages of the transistors coupling the write node to the global bitline when the write voltages are, e.g., ⅓VDD or ⅔VDD.

Next, at time t6, write enable signal WE is asserted, which enables transistor 1130 in each of the blocks DCWL00 through DCWL11. With reference to FIG. 11A, activating transistor 1130 imposes write voltage Vw11 on global bitline GBL0 if both of transistors 1135 and 1140 are enabled. In the case of the latch pair of block DCWL11 shown in FIG. 11A, this will happen if each of latches 1110 and 1125 contains a value indicative of a logic one, in which case write voltage Vw11 is applied to global bitline GBL0.

The latch pair of block DCWL10 shown in FIG. 11B is similar to that of FIG. 11A but the input to latch 1125 from the global bitline is applied to the opposite input node, and the connections to local line pair Dlsb-/Dlsb are reversed. Transistors 1135 and 1140 therefore conduct when the stored bit combination is 10, in which case write voltage Vw10 is imposed on global bitline GBL0. The latch pair of block DCWL01 shown in FIG. 11C imposes write voltage Vw01 on global bitline GBL0 when the stored bit combination is 01, and the latch pair of block DCWL00 shown in FIG. 11D imposes write voltage Vw00 in the global bitline when the stored bit combination is 00. Thus, depending upon the MSB and LSB of the bit combination, one of the four write voltages Vw00, Vw01, Vw10, and Vw11 is imposed on the global bitline when write enable signal WE is asserted at time t6. The write voltage is conveyed via transistor 420 (FIG. 4A) and the respective local bitline BL to the memory cell 102, as discussed above, to store the write voltage in the memory cell. Write-enable signal WE is deasserted when the write operation is completed at time t8. Finally, global precharge signal ΦGBL_PRE is asserted at time t9 to prepare for the next memory-cell access. It is not shown in FIG. 9 that signals MSB_Acc, LSB_Acc, Sense, and ΦMR will be precharged back to the original voltages at time t9.

Figure 13:
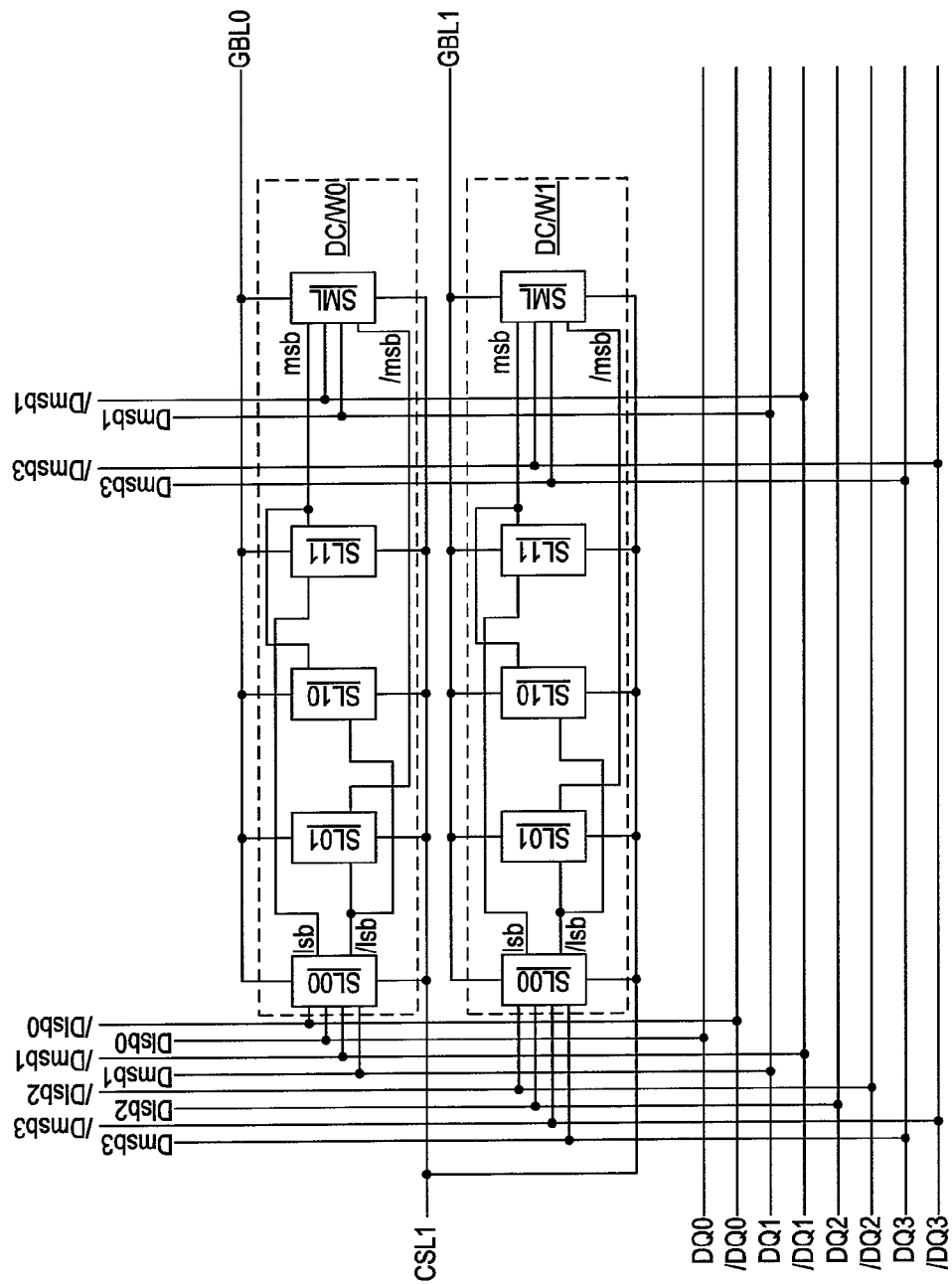
FIG. 13 illustrates how data cache/write circuits DC/W0 and DC/W1 of FIG. 2A are connected to respective global bitlines GBL[1:0] and data-line pairs DQ[3:0] in accordance with another embodiment.

FIG. 13 illustrates how data cache/write circuits DC/W0 and DC/W1 of FIG. 2A are connected to respective global bitlines GBL[1:0] and data line pairs DQ[3:0] in accordance with another embodiment. This embodiment will be described in greater detail below with reference to FIG. 14. Relative to the embodiment of FIG. 10, this embodiment uses fewer latches and connection resources. Column select line CSL1 and associated switches are omitted from FIG. 13 for ease of illustration, but can be implemented as described above in connection with FIGS. 10 and 11A through 11D.

Each data cache/write circuit includes four blocks of switching logic SL00, SL01, SL10, and SL11 and a supplemental MSB latch SML. Switching logic SL00 includes two latches, each to store a respective one of the MSB and the LSB of the bit combination. MSB latch SML includes one latch to store the same MSB as SL11. Rather than including latches in switching logic SL01, SL10, and SL11, switching logic SL00 and latch SML share their respective copies of the LSB and MSB. The resulting reduction in the number of latches reduces complexity compared with the embodiment of FIGS. 11A-11D. The LSB and MSB are conveyed as complementary signals lsb-/lsb and msb-/msb. The nodes carrying these signals are switchably connected to data nodes when column select signal CSL1 is asserted. For example, nodes lsb and /lsb are connected to complementary local line pair Dlsb0 and /Dlsb0, and to data lines DQ0 and /DQ0. Data cache/write circuits DC/W2 and DC/W3 can be implemented in the same way to communicate data over the remaining data lines (FIG. 2A).

Figure 14:
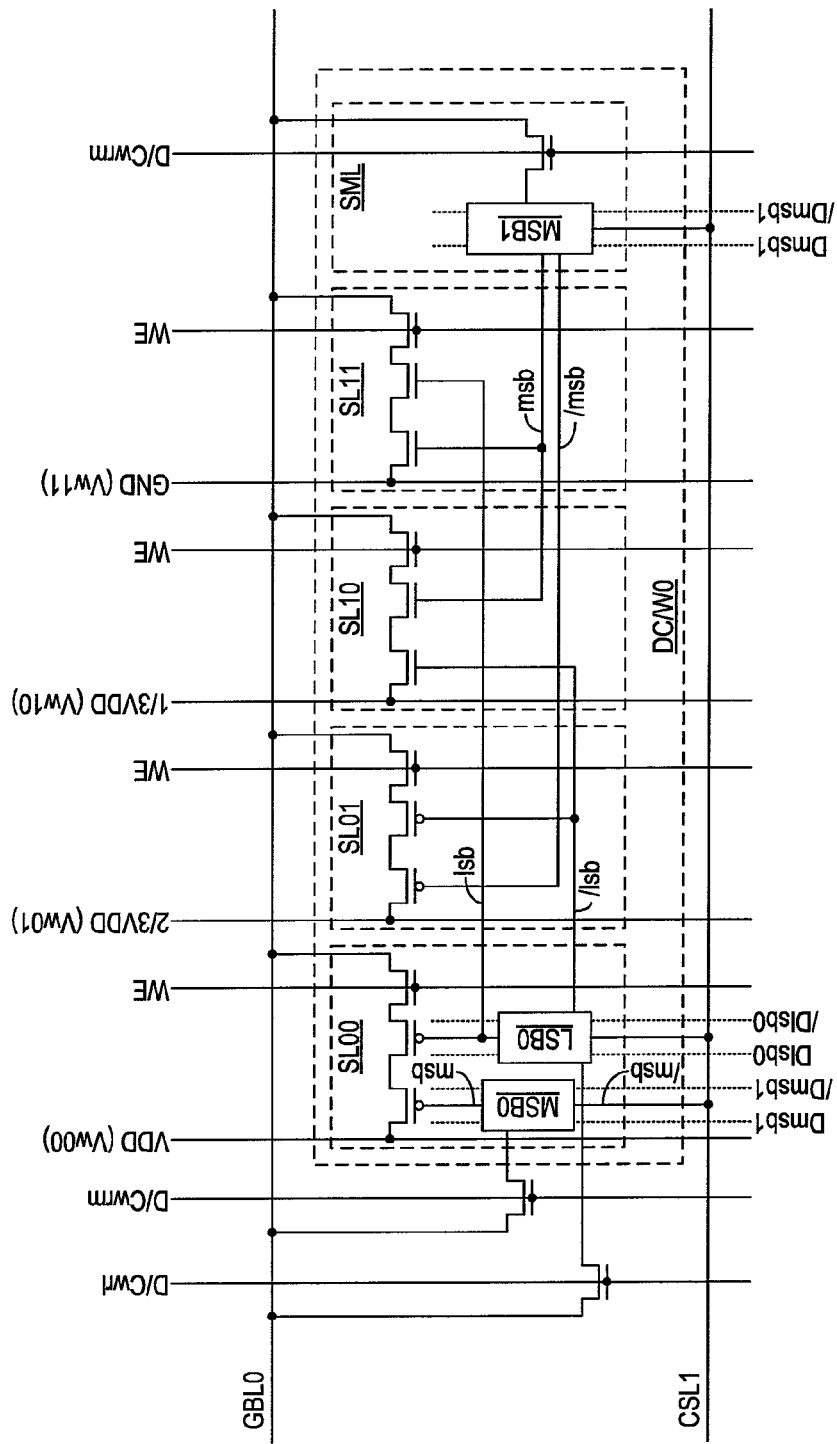
FIG. 14 details an embodiment of data cache DC0 implemented as shown in FIG. 13.

FIG. 14 details an example of an embodiment of data cache/write circuit DC/W0 implemented as shown in FIG. 13. This embodiment is functionally similar to the embodiments of FIGS. 11A-11D, but applies the appropriate write voltage Vw to global bitline GB0 using fewer storage elements.

Select logic SL00 includes an MSB latch MSB0 and an LSB latch LSB0. Supplemental latch SML includes a second MSB latch MSB1 that stores the same value as latch MSB0 when signal D/Cwrm is asserted. Supplemental latch SML may be included to simplify routing for the complementary msb and lsb signals, but may be omitted if, e.g., the msb and /msb outputs from MSB0 are routed to select logic SL01, S110, and SL11. Select logic SL00 connects global bitline GBL0 to write voltage Vw00 (e.g., VDD) when the MSB and LSB are both zero and write enable signal WE is asserted. Select logic SL01, SL10, and SL11 similarly connect global bitline GBL0 to their respective write voltages when the MSB and LSB are the appropriate values. In one embodiment, the transistors controlled by the write enable signal WE in select logic 00 and 01 are PMOS transistors whose gates are coupled to the complement of write enable signal WE. Though not shown, latches MSB0, LSB0, and MSB1 each include transistor switches that allow column select signal CSL1 to connect the complementary msb and lsb nodes to respective complementary local line pairs Dmsb-/Dmsb and Dlsb-/Dlsb.

Figure 15:
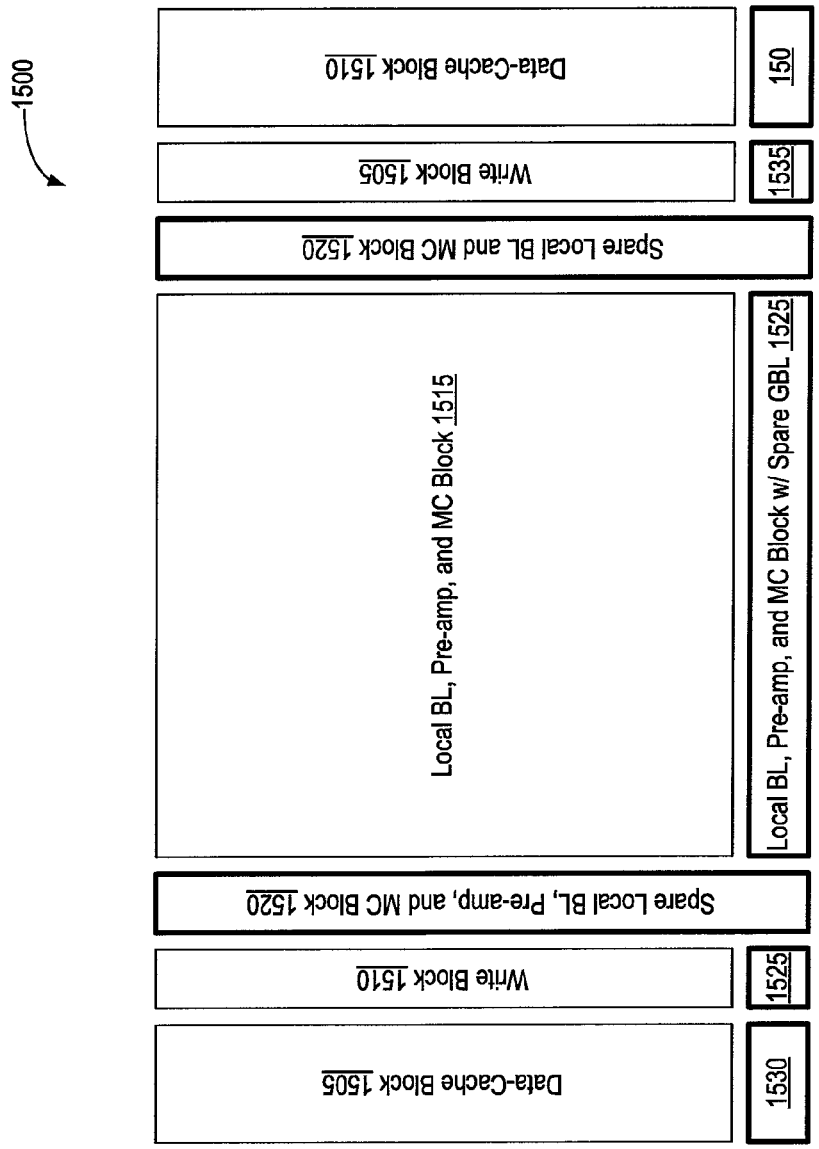
FIG. 15 depicts the layout of a portion of a MLDRAM integrated circuit (IC) 1500 in accordance with one embodiment.

FIG. 15 depicts an example of the layout of a portion of a MLDRAM integrated circuit (IC) 1500 in accordance with one embodiment. Blocks in IC 1500 encompass related structures discussed previously. The data cache circuits and write circuits are organized in respective blocks 1505 and 1510 on either side of IC 1500, and the local bitlines BL, pre-amplifiers, and memory cells MC occupy block 1515 in the middle of the IC.

Conventional DRAM designs have long included redundant structures. Spare elements are used as logical substitutes for defective elements to improve yield. Substitutions are made using physical encoding schemes to address substitute structures in lieu of defective ones. To this end, IC 1500 includes blocks of spare elements as follows. Adjacent block 1515 on opposite sides thereof are blocks 1520 of spare bitlines, pre-amplifiers, and memory cells. Adjacent block 1515 on a third side thereof is an additional block 1525 of spare bitlines, pre-amplifiers, and memory cells, this one also including spare global bitlines. Adjacent each data-cache block 1505 and write block 1510 is a respective block 1530 and 1535 of redundant structures. Methods and circuits for substituting for defective resources are well known, and so are omitted for brevity.

Figure 16:
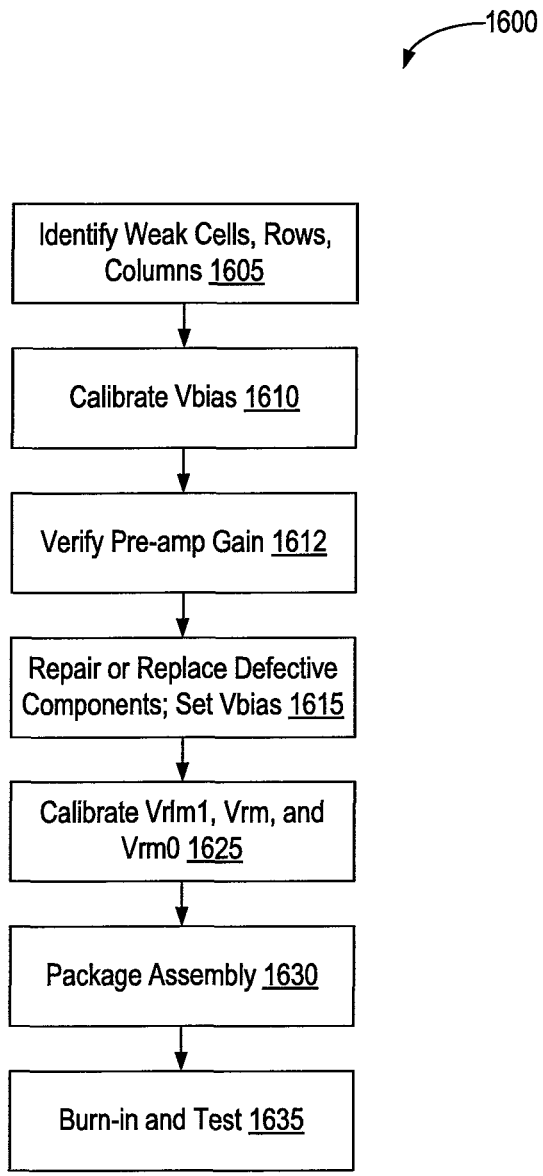
FIG. 16 is a flowchart 1600 outlining a test and calibration procedure for an MLDRAM IC in accordance with one embodiment.

FIG. 16 is a flowchart 1600 outlining an example of a test and calibration procedure for a MLDRAM IC in accordance with one embodiment. At 1605, test vectors are written to and read from the IC to identify gross errors. The reference voltages can be set at their nominal values, such as those depicted in FIG. 7A as Vrlm1, Vrm, and Vrlm0. For these tests, the MLDRAM IC can be treated as a single-level cell in which data is stored using alternative voltage ranges above or below a single reference voltage. Test vectors can be applied separately for each of the multiple reference voltages used in the MLDRAM IC. Weak or defective memory cells, rows, and columns are identified and noted.

Next, at 1610, bias voltage Vbias used in the pre-amplifiers is calibrated. With reference to FIG. 4A, the calibration process adjusts voltage Vbias, and thus the precharge voltage across charge reservoir capacitor 312. This precharge voltage determines the gate voltage at which transistor 310 conducts in response to the change in local bitline voltage caused by connecting the local bit line to a memory cell. Once voltage Vbias is calibrated, the gain of each pre-amplifier is tested (1612) to ensure there is a desired voltage margin around reference voltage Vrlm1 (FIG. 7A) to distinguish voltage ranges Vgbl11 and Vgbl10. Weak or defective pre-amplifiers are identified and noted.

At 1615, the weak or defective elements identified in the preceding tests are replaced with redundant structures. Such programming is accomplished, e.g., by selectively blowing fuses to route addressing information to redundant resources. The optimum bias voltage Vbias identified in 1610 is also programmed, such as by blowing fuses to select alternative nodes of a voltage-divider network.

Voltage references Vrlm1, Vrm, and Vrm0, set to nominal values in 1605, are calibrated in 1625 to optimize voltage margins. As described in more detail below, test vectors are written to the memory array and read back using a range of values for each of the three reference voltages. The reference voltages that give the highest voltage margins are noted and programmed into the IC. ICs that meet minimum performance criteria are packaged in 1630; the remaining ICs are rejected. The packaged ICs are then subjected to burn-in and test procedures (1635).

Figure 17A:
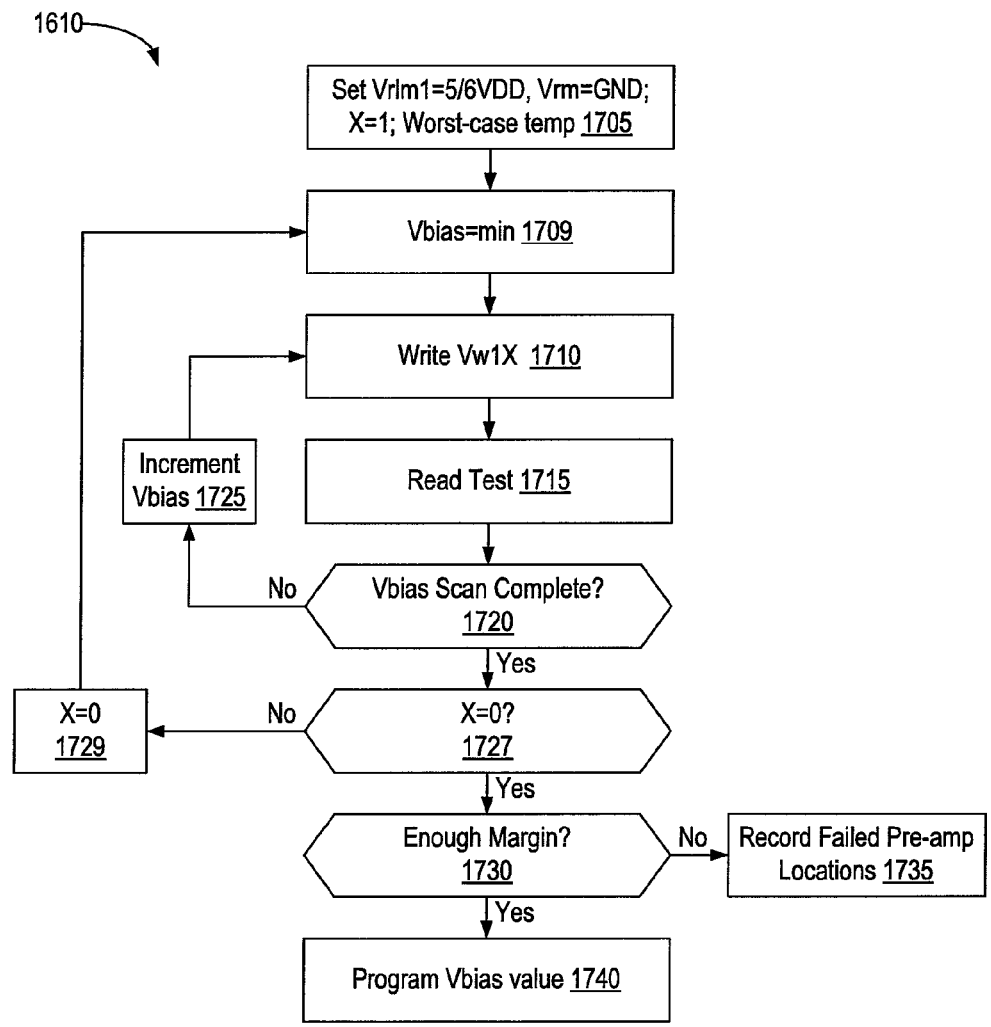
FIG. 17A is a flowchart expanding upon block 1610 of FIG. 16, in which voltage Vbias to the preamplifiers is calibrated.

FIG. 17A is a flowchart illustrating in greater detail the bias voltage Vbias calibration operation shown in block 1610 of FIG. 16. The reference voltage Vrlm1 separating global bitline voltages Vgbl10 and Vgbl11 is set to its default level, ⅝VDD in this example, the middle reference voltage Vrm is set to ground GND, a variable X representative of the LSB is set to 1, and the IC under test is set to a selected worst-case operating temperature (1705). Referring to FIG. 6, setting middle reference voltage Vrm to ground ensures that MSB latch 615 captures a logical one MSB for all global bitline voltages Vgbl used in setting reference voltage Vrlm1. The logical one MSB causes selection logic 627 to refer to a comparison with reference voltage Vrlm1 for the LSB. As shown in FIG. 7A, reference voltage Vrlm1 is used to distinguish between global bitline voltages Vgbl11 and Vgbl10, which represent bit combinations of 11 and 10, respectively.

Bias voltage Vbias is set to its lowest value, min (1709). Next, write voltage Vw11 is written to each memory cell under test (1710). Write voltage Vw11 should produce a read value of binary 11. In 1715, the memory cells are read, and the bit-error rate BER is calculated and stored linked to the current value of Vbias. The bit-error rate is the fraction of the memory cells under test for which the read bit combination differs from the written bit combination. Per decision 1720, the process moves to 1725 if all values of Vbias have been tested. If not, the process moves to 1725 in which the value for Vbias is incremented and the test repeated.

Figure 17B:
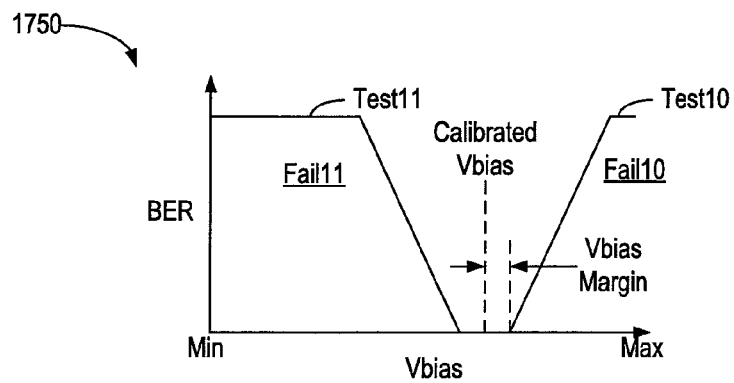
FIG. 17B is a diagram 1750 relating bias voltage Vbias to bit-error rate BER.

FIG. 17B is a diagram 1750 illustrating the relationship between bit-error rate BER and bias voltage Vbias. In this illustration, a line Test11 shows a high BER when cell voltages representing bit combination 11 are read with a relatively low bias voltage Vbias. The BER progressively falls to zero as bias voltage Vbias increases. Completing a Vbias scan with X=1 provides this type of information.

Returning to FIG. 17A, once the first Vbias scan is complete, the variable X is set to zero (1729) and the Vbias scan repeated using write voltage Vw10. A line Test10 in FIG. 17B shows a low BER when cell voltages representing bit combination 10 are read with a relatively low voltage Vbias. The BER progressively increases as voltage Vbias increases. Completing a Vbias scan with X=0 provides this type of information.

The values of bias voltage Vbias at which lines Test11 and Test10 intersect the zero BER axis are used to determine both the calibration level and resulting voltage margin for the bias voltage. The former is the midpoint between the two intersections, while the latter is the difference between the calibrated bias voltage Vbias and either intersection. Per decision 1730, pre-amplifiers that exhibit an unacceptably low voltage margin for bias voltage Vbias are identified for later substitution with spare resources (1735). Assuming there are sufficient resources to pass the overall IC, the calibrated Vbias value is programmed into the IC (1740), such as by blowing fuses.

Figure 18A:
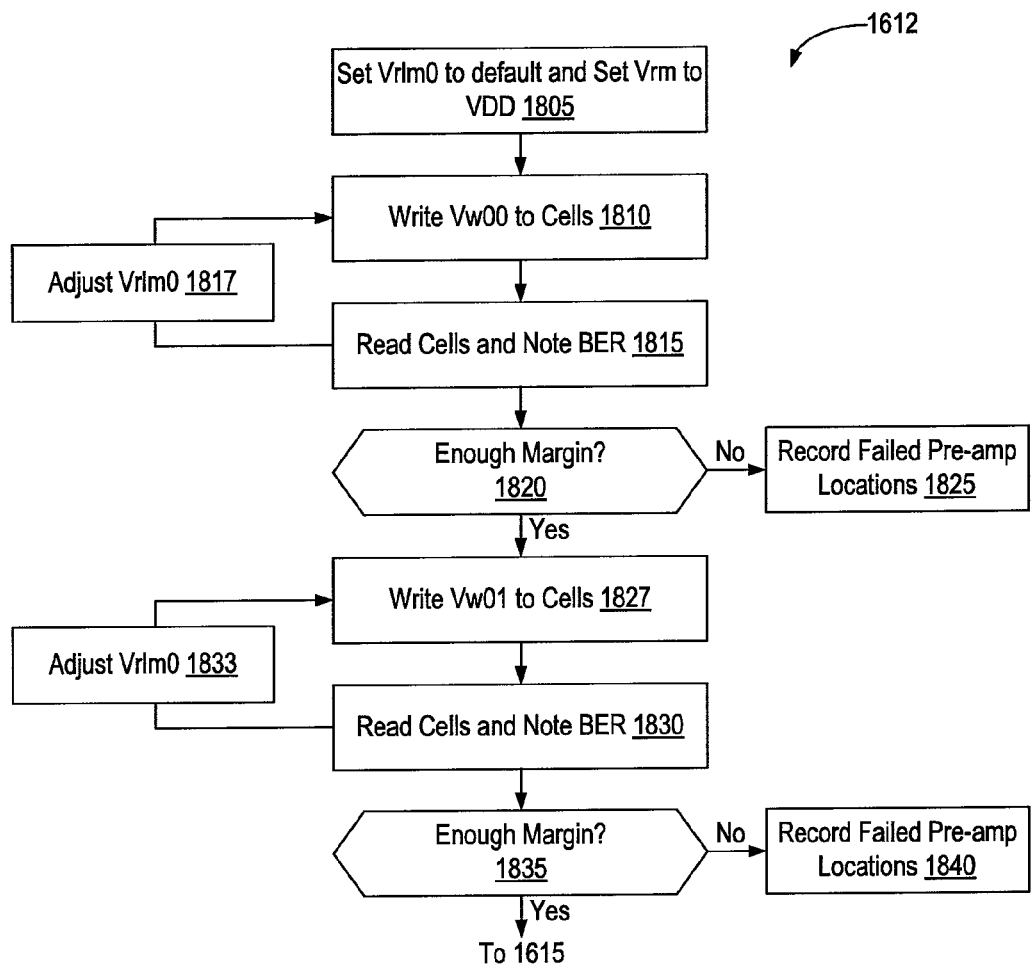
FIG. 18A is a flowchart illustrating pre-amplifier verification 1612 of FIG. 16 in accordance with one embodiment.

FIG. 18A is a flowchart illustrating pre-amplifier gain verification operation 1612 of FIG. 16 in accordance with one embodiment. This verification process tests the preamplifiers to ensure they provide sufficient gain for digitizer DG to distinguish between the relatively high cell-voltage ranges Vc00 and Vc01. As discussed above in connection with FIGS. 4A and 4B, the preamplifiers convert cell voltages Vc00 and Vc01 into global bitline voltages Vgbl00 and Vgbl01, respectively. Digitizers DG then use the lowest reference voltage Vrlm0 to distinguish between global bitline voltages Vgbl00 and Vgbl01, and thus the bit combinations they represent, as shown in FIG. 7A.

Returning to the gain verification sequence of FIG. 18A, the lowest reference voltage Vrlm0 is set to its default value—⅛VDD in FIG. 7B for example—and the middle reference voltage Vrm to supply voltage VDD (1805). Referring to FIG. 6, setting reference voltage Vrm to VDD ensures MSB latch 615 captures a logical zero MSB for all global bitline voltages Vgbl used in setting reference voltage Vrlm0. The logical zero MSB causes selection logic 627 to refer to a comparison with reference voltage Vrlm0 for the LSB. As shown in FIG. 7A, reference voltage Vrlm0 is used to distinguish between global bitline voltages Vgbl00 and Vgbl01, which represent bit combinations of 00 and 01, respectively. Write voltage Vw00 is written to the memory cells under test (1810). In the foregoing embodiments, write voltage Vw00 is a relatively high voltage, VDD, and charges the memory cells with a high cell voltage Vc00 representing bit combination 00.

The memory cells written with voltage Vw00 are read (1815), the corresponding global bitline voltages Vgbl are converted to respective bit combinations by comparing them with reference voltage Vrlm0 and the bit error rate BER of the bit combinations is noted. Reference voltage Vrlm0 is then adjusted (1817) and the write operations and read operations of 1810 and 1815 are repeated until all values of reference voltage Vrlm0 are exhausted. The minimum value of reference voltage Vrlm0 that produces an acceptable BER is noted.

Figure 18B:
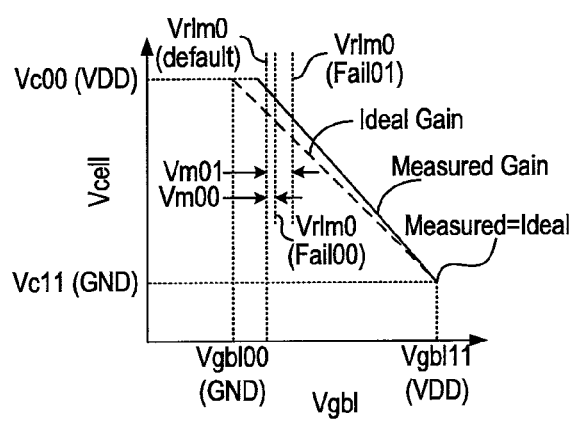
FIG. 18B is a diagram of the relationship between cell voltage Vcell, global bitline voltage Vgbl, and reference voltage Vrlm0 for an exemplary preamplifier with less than ideal gain.

FIG. 18B is a diagram of the relationship between cell voltage Vcell, global bitline voltage Vgbl, and lowest reference voltage Vrlm0 for an exemplary preamplifier with less than ideal gain. As in prior examples, the gamut of cell voltage Vcell, the input to the preamplifiers via local bitline BL, is from ground to VDD. The preamplifiers ideally provide a gain of negative one in this example, so the corresponding gamut of global bitline voltage Vgbl is from VDD to ground. The line labeled "Ideal Gain" has a negative slope because the preamplifiers are inverting.

A second line, "Measured Gain," depicts a preamplifier with a non-ideal gain of less than one. Due to the bias voltage calibration of 1610, the measured gain intersects the ideal gain (Measured=Ideal) when cell voltage Vcell is ground. In decision 1820 of FIG. 18A, gain verification operation 1612 determines whether the preamplifiers provide adequate gain when cell voltage Vcell is in the highest voltage range Vc00 (i.e., whether the preamplifiers produce adequately low global bitline voltages Vgbl from cell voltage Vc00) by scanning reference voltage Vrlm0 to determine the highest level of lowest reference voltage Vrlm0 that delivers an acceptable BER for reading cell voltage Vc00. This level is labeled "Vrlm0 (Fail00)" in FIG. 18B and is referred to below as a "00 failure level." The difference between the 00 failure level and the default value for reference voltage Vrlm0 when interpreting cell voltage Vc00 is voltage margin Vm00.

Per decision 1820, preamplifiers for which voltage margin Vm00 is less than a specified minimum are identified and their locations noted (1825). Preamplifiers that provide acceptable voltage margins Vm00 are subject to a second series of tests to search for a lower boundary of lowest reference voltage Vrlm0 when interpreting cell voltage Vc01, the next-to-highest cell voltage, which represents bit combination 01. The lower boundary of reference voltage Vrlm0 is labeled "Vrlm0 (Fail01)" in FIG. 18B and is referred to below as a "01 failure level" The difference between the 01 failure level and the default value for reference voltage Vrlm0 is voltage margin Vm01.

Returning to FIG. 18A, the test for voltage margin Vm01 begins at 1827, at which time write voltage Vw01 is written to the memory cells under test. Next, in 1830, the cells are read, a bit error rate is determined, and the results noted. The write, read, and BER determination procedures are repeated while adjusting reference voltage Vrlm0 (1833) to determine the minimum level of reference voltage Vrlm0 that delivers an acceptable BER for reading cell voltage Vc01. This level of reference voltage Vrlm0 is the 01 failure level. The difference between the 01 failure level and the default value for reference voltage Vrlm0 when interpreting cell voltage Vc01 is voltage margin Vm01. Per decision 1835, preamplifiers for which voltage margin Vm01 is less than a specified minimum are identified and their locations noted (1840). Preamplifiers that provide acceptable voltage margins Vm01 pass the gain test and move on to 1615 (FIG. 16). The voltage margins can be positive or negative, and preamplifiers can fail for having too much or too little gain.

Figure 19A:
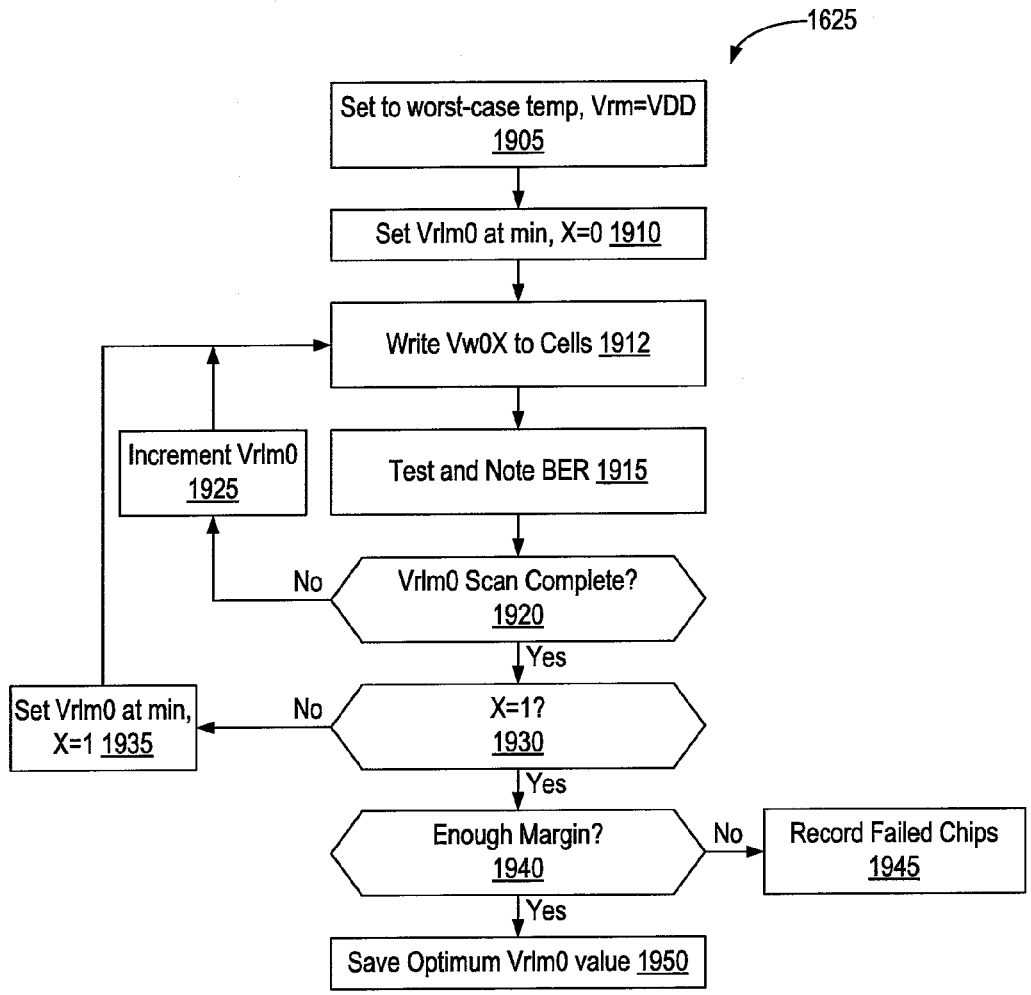
FIG. 19A is a flowchart illustrating reference-voltage calibration 1625 of FIG. 16 in accordance with one embodiment.

FIG. 19A is a flowchart illustrating reference-voltage calibration operation 1625 of FIG. 16 in accordance with one embodiment. This calibration process finds the values of reference voltages Vrlm1, Vrm, and Vrlm0 that provide the highest voltage margins, and identifies ICs for which these voltage margins are inadequate. FIG. 19A only illustrates how lowest reference voltage Vrlm0 is calibrated and the associated voltage margin measured: the remaining reference voltages Vrm and Vrlm1 are calibrated similarly, as discussed below, so a detailed discussion of their calibration and voltage margin measurements is omitted for brevity.

In 1905, the IC under test is set to a worst-case temperature, so the subsequent calibration process ensures reliable operation, and the middle reference voltage Vrm used to distinguish the MSB is set high, e.g., to VDD, for reasons similar to those described above with reference to operation 1805 of FIG. 18A.

Next, the reference voltage under test, Vrlm0, is set to a minimum and a variable X representing the LSB is set to zero (1910). Write voltage Vw0X is written to the memory cells under test (1912). X is zero at this point in the process, so write voltage Vw00, representing bit combination 00, is written. The memory cells are then read, a BER is determined and the BER is stored linked to the value of the reference voltage (1915). The timing between writes and reads (1912 and 1915) can be varied over multiple test sequences to measure cell retention.

Per decision 1920, if each value of reference voltage Vrlm0 has been used, then the scan is complete and the process moves to decision 1930. If the scan is incomplete, the value of reference voltage Vrlm0 is incremented (1925) and the process returns to 1912. The test and BER measurement of 1915 is thus repeated for a range of Vrlm0 values.

Figure 19B:
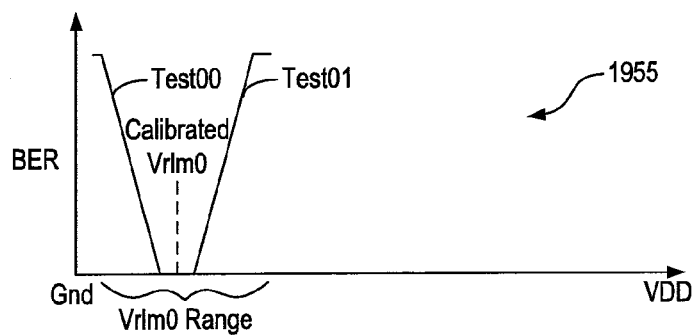
FIG. 19B is a diagram 1955 illustrating the relationship between reference voltage Vrlm0 and bit error rate (BER).

FIG. 19B is a diagram 1955 illustrating the relationship between reference voltage Vrlm0 and bit error rate (BER). The line Test00 shows how the BER declines as reference voltage Vrlm0 is increased.

Returning to decision 1930 of FIG. 19A, and assuming a completed scan in which X=0, reference voltage Vrlm0 is returned to the minimum value and the variable X is changed to one (1935). The above-described test sequence is then repeated for write voltages of Vw01. As shown in FIG. 19B, a line Test01 shows how the BER increases as reference voltage Vrlm0 is increased. The points at which lines Test00 and Test01 intersect the zero BER axis are used to determine both the calibration level and resulting voltage margin for reference voltage Vrlm0. The former is the midpoint between the two intersections, while the latter is the difference between the calibration level and either intersection.

When scans are completed for both values of X and the calibration level and corresponding voltage margin have been determined, then the process of FIG. 19A reaches decision 1940. If the voltage margin for reference voltage Vrlm0 is less than the minimum specified, then all or a portion of the IC under test is marked as having failed (1945). If the voltage margin meets specification, then the calibration value for reference voltage Vrlm0 is saved (1950).

The process of FIG. 19A is repeated, with minor modifications, for reference voltages Vrlm1 and Vrm. When scanning highest reference voltage Vrlm1, middle reference voltage Vrm is set low (e.g., to ground) so the MSB remains at one; write voltages Vw11 and Vw10 are then used to find the calibration value and voltage margin of highest reference voltage Vrlm1. When scanning middle reference voltage Vrm, reference voltages Vrlm0 and Vrlm1 can remain at their default or calibrated values; write voltages Vw10 and Vw01 are used to find the calibration level and voltage margin for reference voltage Vrm.

Figure 20:
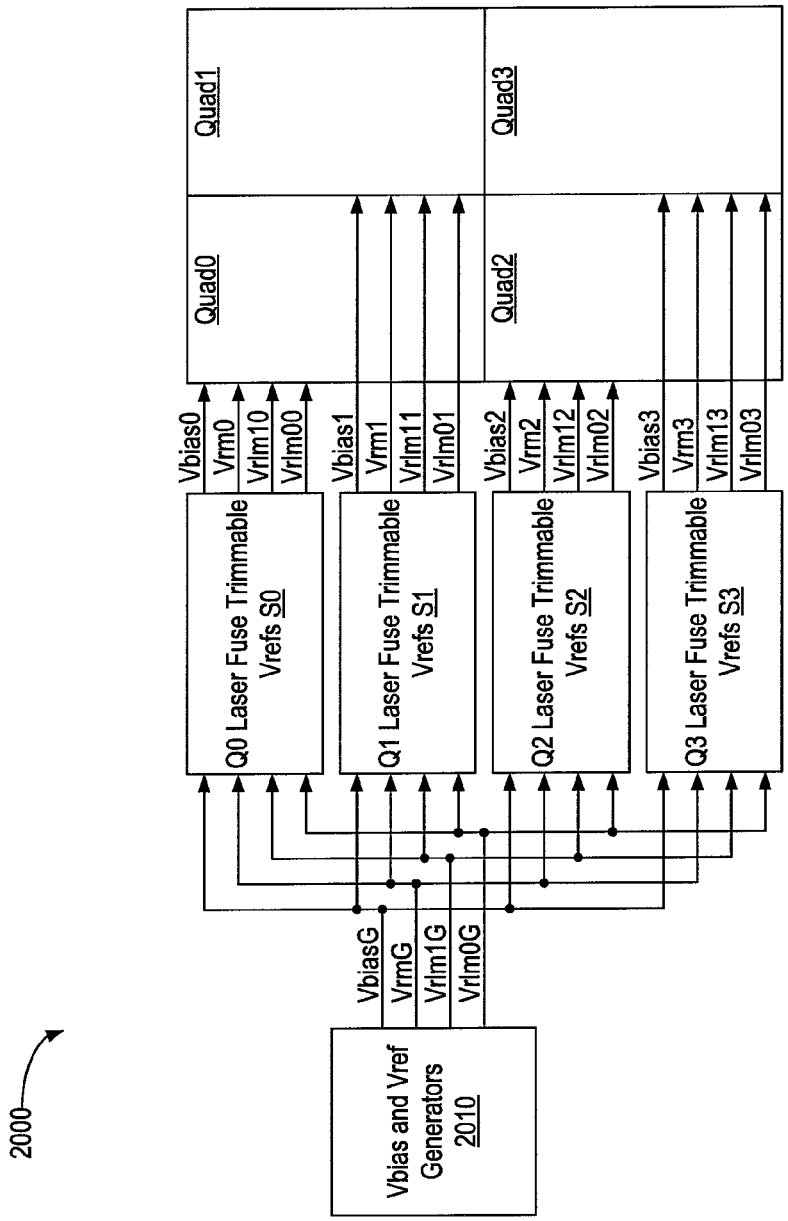
FIG. 20 depicts a multi-level DRAM IC 2000 in accordance with one embodiment.

FIG. 20 depicts a multi-level DRAM IC 2000 in accordance with one embodiment. IC 2000 includes four quadrants Quad[3:0], each of which includes one or more separately addressable arrays of memory cells. The optimum bias and reference voltages can vary across the IC due to, e.g., process, supply-voltage, and temperature variations. Each of the quadrants is therefore provided with a corresponding voltage source S[3:0] that generates from a global voltage generator 2010 quadrant reference voltages VbiasQ[0:3], VrmQ[0:3], Vrlm1Q[0:3], and Vrlm0Q[0:3] that are used throughout the respective quadrant. Voltage sources S[3:0] trim the quadrant reference voltages using, e.g., laser fuses in this example, but can use other programmable structures in other embodiments.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. Additionally, the prefix symbol "/" attached to signal names indicates that the signal is an active low signal (i.e., the asserted state is a logic low state). In any case, whether a given signal is an active low or an active high will be evident from the above description.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuits that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Such data structures can be derived from schematic diagrams of the type detailed above and the corresponding descriptions and the data structures on can be encoded on a computer-readable medium. Such encoded data can be used to fabricate integrated circuits comprising one or more of the circuits described herein.

While the present invention has been described in connection with specific embodiments, variations of these embodiments are also envisioned. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations. Therefore, the scope of the appended claims should not be limited to the foregoing description. Only those claims specifically reciting "means for" or "step for" should be construed in the manner required under the sixth paragraph of 35 U.S.C. §112.

What is claimed is:

1. A dynamic memory, comprising:
   a memory cell to store an analog cell voltage representing an original bit combination comprising more than one data bit;
   a local bitline coupled to the memory cell to receive the analog cell voltage as an attenuated voltage;
   a global bitline;
   a preamplifier comprising an input node and an output node, the input node coupled to the local bitline, the output node coupled to the global bitline; and
   a digitizer coupled to the global bitline to output a respective read bit combination identical to the original bit combination in response to an amplified analog signal received from the preamplifier;
   wherein the digitizer imposes the read bit combination on the global bitline.

2. The dynamic memory of claim 1, further comprising a data cache coupled to the digitizer to receive the read bit combination.

3. The dynamic memory of claim 2, further comprising a write circuit coupled to the data cache and the global bitline to impose a write voltage on the global bitline for writing to the memory cell, the write voltage corresponding to the read bit combination stored in the data cache.

4. The dynamic memory of claim 2, wherein the data cache additionally comprises data lines to output the read bit combination and to receive a new bit combination for writing.

5. The dynamic memory of claim 4, additionally comprising a switching element disposed between the global bitline and the local bitline to apply the analog cell voltage to the memory cell.

6. The dynamic memory of claim 1, wherein the preamplifier is inverting.

7. The dynamic memory of claim 1, wherein the preamplifier comprises a reservoir capacitor having a first capacitance, a sense node having a second capacitance, less than the first capacitance, and a transistor having a control terminal coupled to the input node, a first current-handling terminal coupled to the reservoir capacitor, and a second current-handling terminal coupled to the sense node.

8. The dynamic memory of claim 7, wherein the memory cell exhibits a memory-cell capacitance, the local bitline exhibits a bitline capacitance, and the product of the first capacitance and the memory-cell capacitance equals the product of the second capacitance and the bitline capacitance.

9. The dynamic memory of claim 7, wherein the preamplifier additionally comprises an amplifier coupled between the sense node and the global bitline.

10. The dynamic memory of claim 9, additionally comprising a switching element disposed between the preamplifier output node and the global bitline.

11. The dynamic memory of claim 1, in which the digitizer comprises reference-voltage nodes to receive respective reference voltages with which the digitizer compares the amplified analog signal.

12. The dynamic memory of claim 11, wherein the reference voltages include a first reference voltage, a second reference voltage differing from the first reference voltage by a first voltage difference, and a third reference voltage differing from the second reference voltage by a second voltage difference equal to the first voltage difference.

13. The dynamic memory of claim 11, wherein the reference voltages include a first reference voltage, a second reference voltage differing from the first reference voltage by a first voltage difference, and a third reference voltage differing from the second reference voltage by a second voltage difference different from the first voltage difference.

14. A method of reading an original bit combination comprising more than one bit, the original bit combination represented by charge stored in a memory cell, the method comprising:
   sharing the charge between the memory cell and a local bitline to develop a first bitline voltage;
   amplifying the first bitline voltage to produce a second bitline voltage on a global bitline; and
   digitizing the second bitline voltage to generate a respective read bit combination identical to the original bit combination; and
   imposing the read bit combination on the global bitline.

15. The method of claim 14, wherein the imposing comprises sequentially imposing the bits constituting the read bit combination on the global bitline.

16. The method of claim 14, wherein the original bit combination consists of n bits, where n is a positive integer greater than unity, and the method additionally comprises selecting a respective one of $2^n$ write voltages in response to the read bit combination.

17. The method of claim 16, additionally comprising storing the selected one of the write voltages in the memory cell.

18. The method of claim 16, wherein the write voltages are evenly spaced.

19. The method of claim 16, wherein the write voltages include first and second write voltages separated by a first difference, and third and fourth write voltages separated by a second difference, the second difference different from the first difference.

20. The method of claim 19, wherein the second difference is greater than twice the first difference.

21. The method of claim 20, wherein the second and third write voltages are separated by a third difference greater than the first difference and less than the second difference.

* * * * *